United States Patent
Singer et al.

(10) Patent No.: US 11,530,999 B2
(45) Date of Patent: Dec. 20, 2022

(54) PORE CONTRIBUTION CORRECTED QUANTIFYING OF SURFACE ROUGHNESS

(71) Applicant: Halliburton Energy Services, Inc., Houston, TX (US)

(72) Inventors: Gabriela Singer, Richmond, TX (US); Songhua Chen, Katy, TX (US); Shouxiang Ma, Dhahran (SA)

(73) Assignee: Halliburton Energy Services, Inc., Houston, TX (US)

( * ) Notice: Subject to any disclaimer, the term of this patent is extended or adjusted under 35 U.S.C. 154(b) by 356 days.

(21) Appl. No.: 16/888,134

(22) Filed: May 29, 2020

(65) Prior Publication Data
US 2021/0373106 A1 Dec. 2, 2021

(51) Int. Cl.
*G01N 24/08* (2006.01)
*G01R 33/56* (2006.01)
(Continued)

(52) U.S. Cl.
CPC ....... *G01N 24/081* (2013.01); *G01N 15/0806* (2013.01); *G01N 15/088* (2013.01);
(Continued)

(58) Field of Classification Search
CPC ............ G01N 15/0806; G01N 15/088; G01N 24/081; G01B 7/34; G01B 21/30; G01R 33/5604; E21B 49/02
See application file for complete search history.

(56) References Cited

U.S. PATENT DOCUMENTS

| | | | | |
|---|---|---|---|---|
| 2010/0128932 A1* | 5/2010 | Dvorkin | ................. | E21B 47/00 382/109 |
| 2014/0270393 A1* | 9/2014 | Louis | ..................... | G06F 30/20 382/109 |

(Continued)

OTHER PUBLICATIONS

Fredrich, "3D Imaging of Porous Media using Laser Scanning Confocal Microscopy with Application to Microscale Transport Processes", Physics and Chemistry of the Earth, Part A: Solid Earth and Geodesy vol. 24, Issue 7, 1999, pp. 551-561.
(Continued)

*Primary Examiner* — Benjamin R Schmitt
(74) *Attorney, Agent, or Firm* — Delizio, Peacock, Lewin & Guerra

(57) ABSTRACT

To separate porosity from surface roughness, length scales for pore size and surface roughness are identified. These length scales are determined from surface roughness measurements and confirmed via NMR pore body calculations and pore size capillary pressure measurements. A filter removes pore contribution to surface roughness measurements and delivers intrinsic surface roughness. Additional filters and methods determine the minimum magnification on which to base surface roughness calculation, based on size of the field of view and where measured surface roughness approaches intrinsic surface roughness as magnification increases but larger magnification increase sampling time and difficulty. Sample irregularities, such as saw marks, are also filtered out or determined to be too large to remove via filter and another area of measurement is located. With the pore corrected quantification of surface roughness, surface relaxivity and pore distribution can be calculated with greater accuracy.

20 Claims, 10 Drawing Sheets

(51) Int. Cl.
  *G01N 15/08*  (2006.01)
  *G01B 7/34*  (2006.01)
  *G01B 21/30*  (2006.01)

(52) U.S. Cl.
  CPC ............ *G01R 33/5604* (2013.01); *G01B 7/34* (2013.01); *G01B 21/30* (2013.01)

(56) References Cited

U.S. PATENT DOCUMENTS

2015/0177351 A1* 6/2015 Venkataramanan ..... G01V 3/32
  324/309
2018/0003653 A1* 1/2018 Tinni .................... G01N 15/08

OTHER PUBLICATIONS

Grzelak, et al., "Nanoscale Limit to the Applicability of Wenzel's Equation", Langmuir 2010, 26 (16), pp. 13297-13304, https://doi.org/10.1021/la1016164, Jul. 20, 2010.
Kubiak, et al., "Wettability versus roughness of engineering surfaces", Wear. 271 (2011) pp. 523-528, http://dx.doi.org/10.1016/j.wear.2010.03.029.
Looyestijn, "Practical Approach to Derive Wettability Index by NMR in Core Analysis Experiments", Petrophysics, vol. 60, No. 4 (Aug. 2019), 7 pages.
Nordin, et al., "The Effect of Rough Surfaces on Nuclear Magnetic Resonance Relaxation Experiments", arXiv:1512.06711v1 [physics.chem-ph] Dec. 18, 2015, 10 pages.
Nosonovsky, "On the Range of Applicability of the Wenzel and Cassie Equations", Langmuir 2007, 23, pp. 9919-9920, https://doi.org/10.1021/la701324m, Aug. 1, 2007.

\* cited by examiner

PORES WITH EQUIVALENT DIAMETERS

PORES WITH EQUIVALENT SURFACE TO VOLUME RATIOS

L/W IS A DIMENSIONLESS MEASURE OF SURFACE ROUGHNESS FOR SURFACE DEFORMITIES EXCLUDING PORES

SPHERICAL PORE WITH "BUMP"

$\Omega$ Rough Surface Effect
$\Gamma$ Effective Surface Area

RECTANGULAR "BUMP"

CYLINDRICAL "BUMP"

T₂ DISTRIBUTION FOR BIMODAL PORE SIZE DISTRIBUTION

PORE SIZE DISTRIBUTION BASED ON T₂ RELAXATION TIME DISTRIBUTION

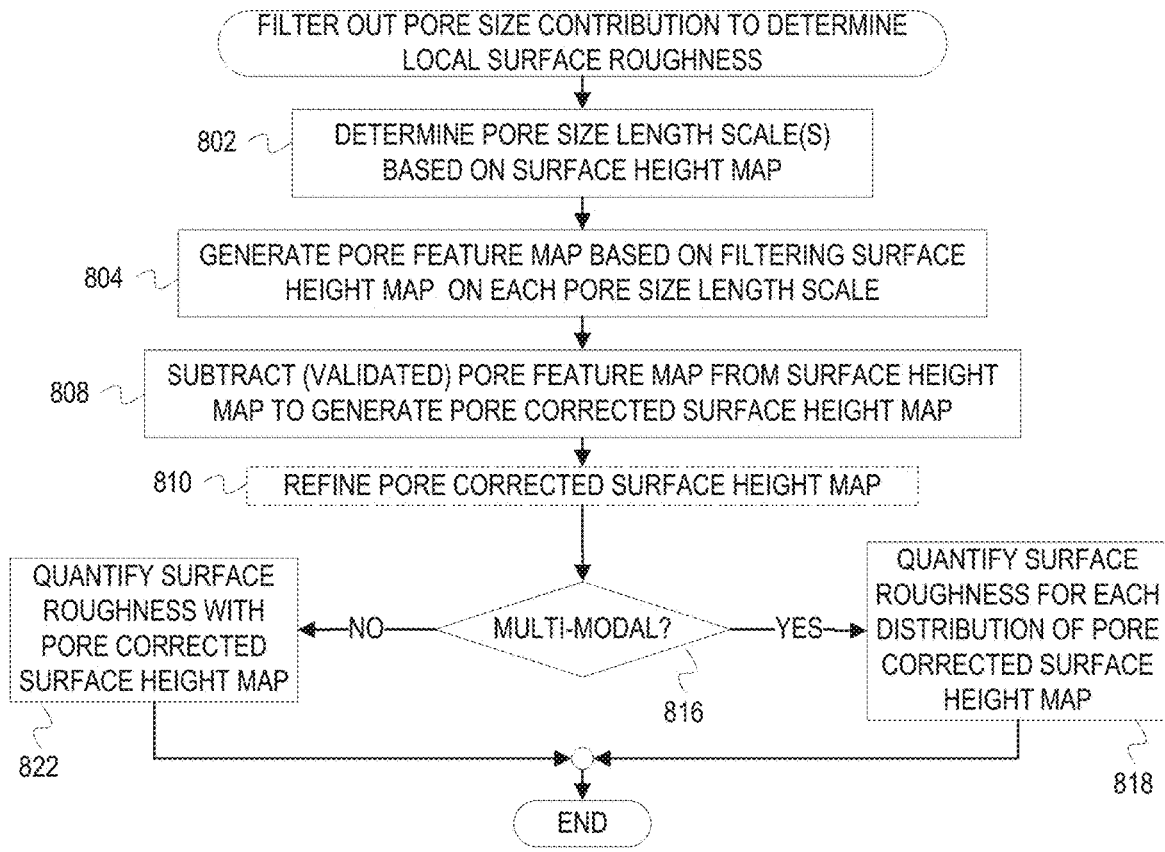
FIG. 8A
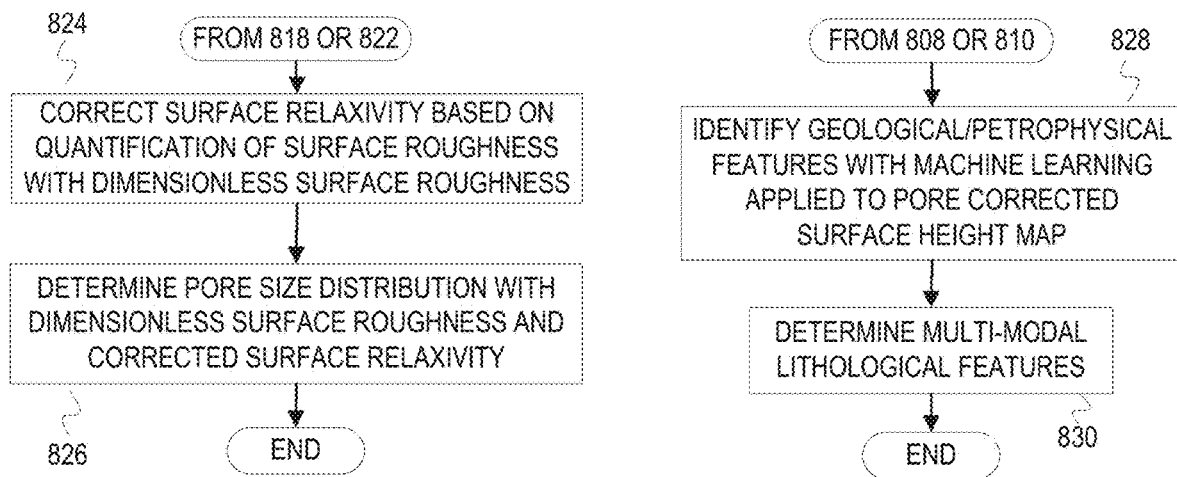
FIG. 8B
FIG. 8C

PORE CONTRIBUTION CORRECTED QUANTIFYING OF SURFACE ROUGHNESS

TECHNICAL FIELD

The disclosure generally relates to measuring and testing and investigating or analyzing materials by determining their chemical or physical properties.

BACKGROUND

Pore diameter is a petrophysical parameter of importance for determining reservoir and field extraction costs. Nuclear magnetic resonance (NMR) logging and core sample analysis yield surface to volume (SN) ratios for fluid in pores based on $T_1$ or $T_2$ relaxation times (or both $T_1$ and $T_2$ relaxation times) and accounting from the type of fluid and mineral composition of the rock. Pore dimensions can be calculated from SN ratios based on effective surface relaxivity which accounts for the geometric effect on surface relaxivity and which can be an order of magnitude different from the intrinsic surface relaxivity. Pore size and concentration—collectively pore size distribution—and surface roughness effect surface relaxivity in different ways but are often unable to be separately measured.

BRIEF DESCRIPTION OF THE DRAWINGS

Embodiments of the disclosure may be better understood by referencing the accompanying drawings.

FIG. 8A is a flowchart of example operations for measuring local surface roughness.

FIG. 8B is a flowchart of example operations for determining pore size distribution based on surface roughness filtered to exclude pore size contribution.

FIG. 8C is a flowchart of example operations for determining mineralogy features in multi-modal samples.

DESCRIPTION

Figure 1:
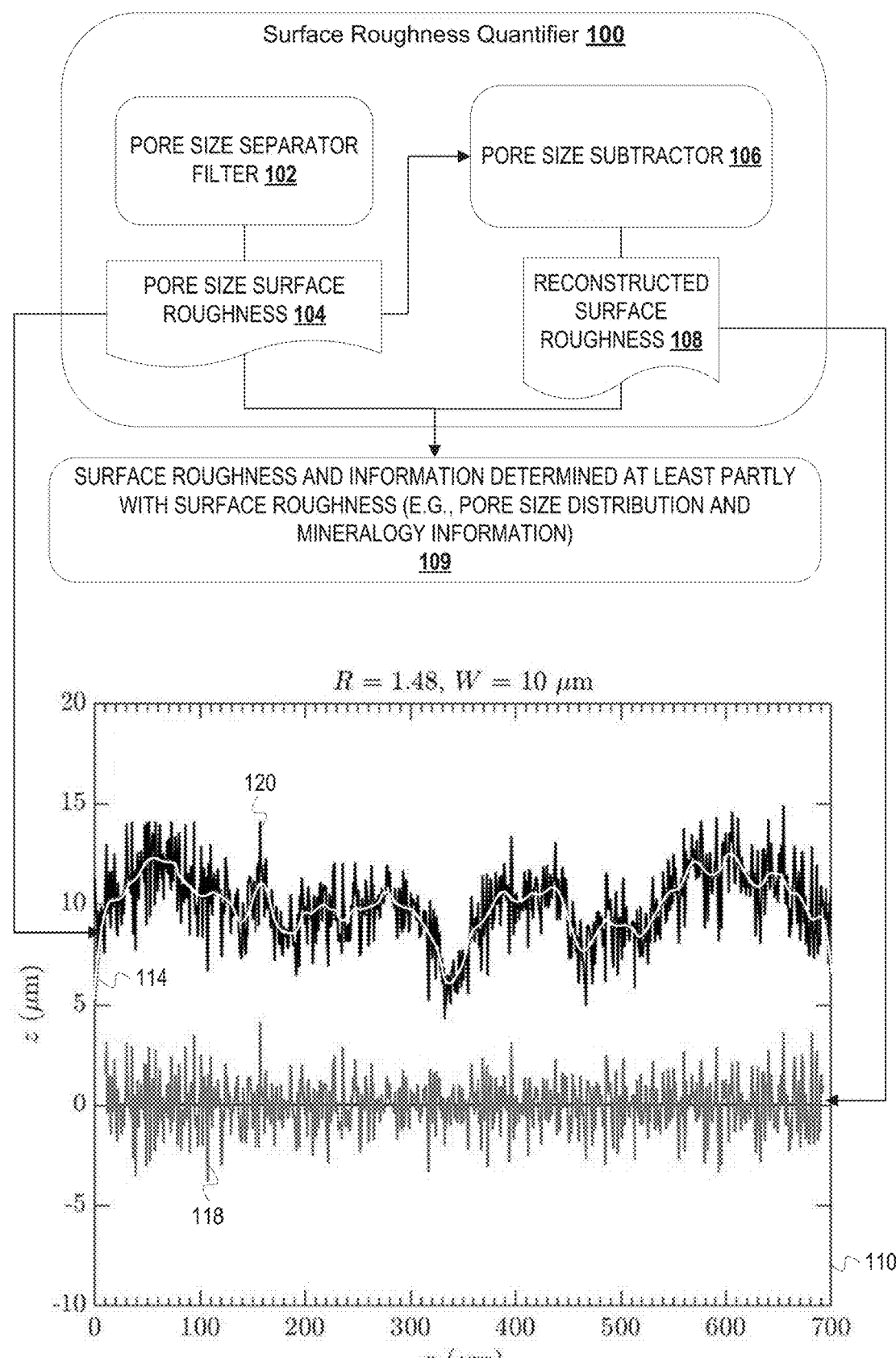
FIG. 1 illustrates an example LCSM data plot where pore size is detected and subsequently removed from raw 1D surface data to reconstitute intrinsic surface roughness.

The description that follows includes example systems, methods, techniques, and program flows that embody aspects of the disclosure. However, this disclosure may be practiced without constraint to these specific examples. For instance, this disclosure refers to laser confocal scanning microscopy (LCSM) in illustrative examples. Aspects of this disclosure can be also used with other measuring methods, examples of which include stylus or probe mechanical contact measurements, optical or X-ray diffraction measurements, or AFM measurements. In other instances, well-known instruction instances, protocols, structures and techniques have not been shown in order not to obfuscate the description.

Overview

Surface roughness measurements deconvolved from pore distribution effects yield more accurate surface relaxivity coefficients, thereby improving measurement of pore size (based on NMR-derived S/V ratios) and other petrophysical parameters of importance, such as wettability, permeability, etc. Surface roughness and porosity both effect surface metrology and other surface defect measurement, such as laser confocal scanning microscopy (LCSM), when pore sizes and surface roughness are within several orders of magnitude of each other, as is true for carbonates and other permeable reservoir rock types.

In order to separate porosity from surface roughness, length scales for pore size and surface roughness are identified. These length scales are determined from surface roughness measurements and confirmed via NMR pore body calculations and pore size capillary pressure measurements. A filter, such as a 1D gaussian filter, removes pore contribution to surface roughness measurements and delivers intrinsic surface roughness. Additional filters and methods determine the minimum magnification on which to base surface roughness calculation, based on size of the field of view and where measured surface roughness approaches intrinsic surface roughness as magnification increases but larger magnification increase sampling time and difficulty. Sample irregularities, such as saw marks, are also filtered out or determined to be too large to remove via filter and another area of measurement is located.

From the intrinsic surface roughness, a roughness corrected surface relaxivity is calculated. Pores with different surface roughness and the same volume appear as different S/V ratios in NMR data while pores appearing in NMR data as a single S/V grouping can have very different pore diameters (and volumes) if their surface areas are also proportional where $S_1V_1=S_2V_2$ but $V_1 \neq V_2$. The roughness corrected surface relaxivity applied to diffusivity from NMR data produces accurate S/V ratios and improves pore distribution calculations versus effective surface relaxivity calculations that do not account for intrinsic surface roughness. Including intrinsic surface roughness in surface relaxivity calculations improves pore distribution measurements, including by improving measurements of pore surface area S.

Example Illustrations

FIG. 1 illustrates an example surface roughness quantifier where the pore size contribution to surface roughness is identified and removed in order to calculate the intrinsic surface roughness separately from pore topology. The surface roughness quantifier 100 includes a pore size separator filter 102 and a pore size subtractor 106. The pore size separator filter 102 operates on the surface roughness or surface metrology data, such as that from LCSM, mechanical contact, ARM, etc., to identify which variations in surface height are due to the presence of pores and which variations correspond to surface roughness. The pore size separator filter 102 identifies, such as through a gaussian or another filter, a pore size surface roughness 104 or pore size profile that corresponds to the portion of the surface roughness resulting from the presence of pores. A pore size subtractor 106 then subtracts the pore size surface roughness 104 from the as-measured surface roughness in order to generate a reconstructed surface roughness 108 that corresponds to the intrinsic surface roughness for surface variations smaller than the pore size.

Graph 110 displays a surface roughness profile 120 as measured for a rock sample. From the surface roughness profile 120, the pore size separator filter 102 identifies a pore size surface roughness profile 114 which includes the surface roughness component on the order of pore size. The pore size subtractor 106 subtracts the pore size surface roughness profile 114 from the surface roughness profile 120 to generate a reconstructed surface roughness 118. The reconstructed surface roughness 118 contains data about the surface roughness for sizes smaller than the pore size and can therefore be used to determine the surface area of pores. With the quantification of surface roughness (e.g., reconstructed surface roughness 118) for a formation sample, information 109 that informs reservoir surveying, for instance, can be determined. As illustrated in FIG. 1, the information 109 can include the quantification of surface roughness, pore distribution, and mineralogy information.

For pores without surface roughness (i.e. ideal pores) or pores where surface roughness is orders of magnitudes smaller than pore diameter, ideal surface to volume ratios are proportional to a characteristic length for pore size. For an ideal spherical pore, that relationship is governed by Equation 1.

$$\frac{S}{V} = \frac{4\pi r^2}{\frac{4}{3}\pi r^3} = 3r \qquad \text{Eq. 1}$$

For an ideal cylindrical pore with radius r and length l, that relationship is governed by Equation 2.

$$\frac{S}{V} = \frac{2\pi r^2 + 2\pi r * l}{\pi r^2 * l} = \frac{2(r+l)}{r*l} \qquad \text{Eq. 2}$$

For real pores accounting for surface roughness, pore volume approximates ideal pore volume but pore surface area can be orders of magnitude larger than ideal surface area. The relationship between the surface area of a smooth surface and the surface area of a rough surface is given by the interfacial area ratio parameter for Equation 3.

$$S_{dr} = \frac{\text{(Rough Surface Area)} - \text{(Cross Sectional Surface Area)}}{\text{(Cross Sectional Surface Area)}} \qquad \text{Eq. 3}$$

The cross-sectional area is readily calculable from endpoints, while the rough surface area can be extracted from three dimensional measurements of surface height or approximated from a surface roughness parameter. The mathematical relationship between a surface height z(x, y) and $S_{dr}$ is governed by Equation 4.

$$S_{dr} = \frac{1}{A}\left[\int\int\left(\sqrt{1 + \left(\frac{\partial z(x,y)}{\partial x}\right)^2 + \left(\frac{\partial z(x,y)}{\partial y}\right)^2} - 1\right)dxdy\right] \qquad \text{Eq. 4}$$

Figure 2:
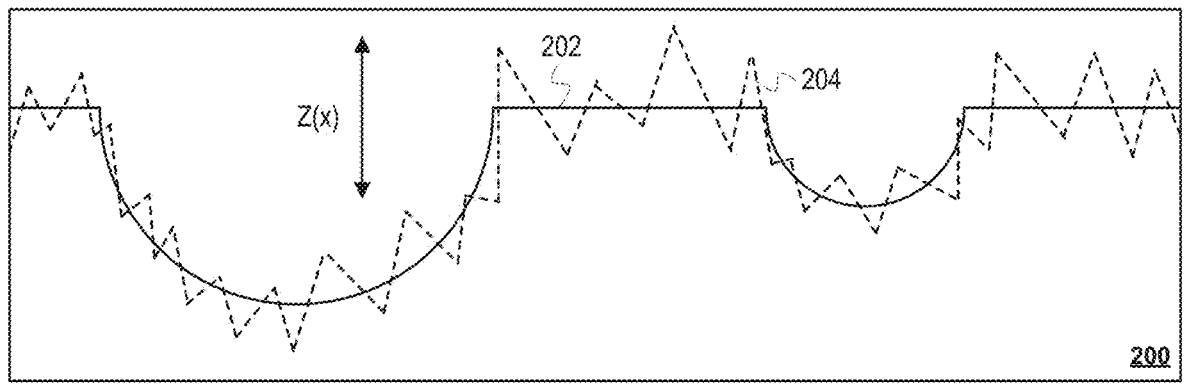
FIG. 2 illustrates the difference between local surface roughness and the porosity contribution to surface roughness.
Figure 2:
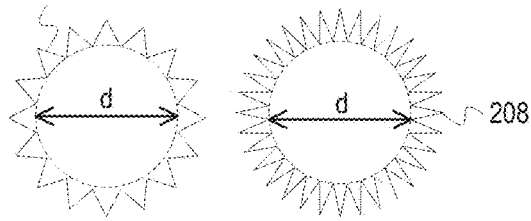
Figure 2:
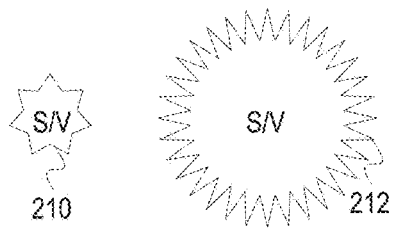
Figure 2:
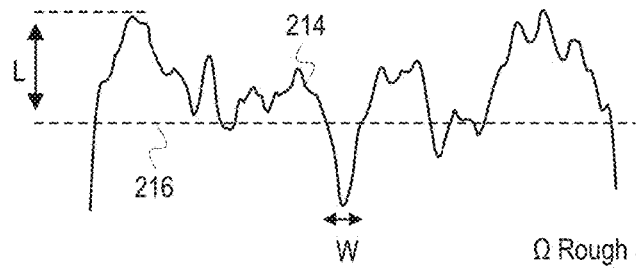
Figure 2:
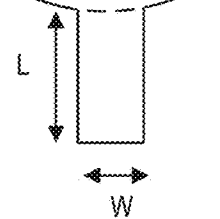
Figure 2:
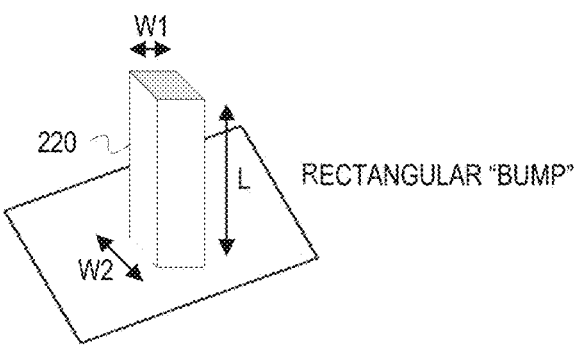
Figure 2:
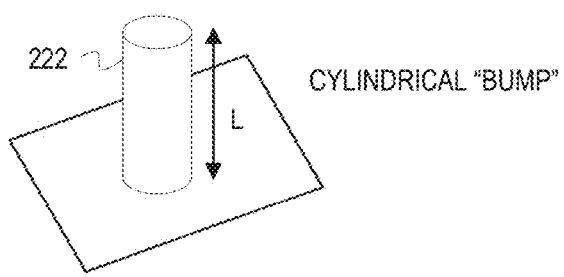

FIG. 2 illustrates the difference between local surface roughness and the porosity contribution to surface roughness. Local surface roughness hereinafter refers to the surface roughness present inside pores and on surfaces excluding the pore size effects. Local surface roughness occurs on a length scale smaller than the pore size length scale.

Surface graph 200 depicts surface topology showing both ideal or smoothed surface height 202 and surface height including surface roughness 204. Surface roughness includes atomic scale effects. However, measuring surface roughness whether through contact measurements, optical means, or even with high energy electromagnetic radiation through electron microscopy or X-ray crystallography often cannot resolve near-atomic scale roughness features. This is because each method of measurement convolves the measurement device length scale (stylus tip size, optical resolution or zoom, etc.) with the measured features. The smoothed surface height 202 shows an ideal flat surface interrupted by two spherical pores, while the surface height including surface roughness 204 shows a variable surface where surface roughness magnitude is smaller than pore radius. Even though surface roughness is smaller than the pore radius, surface roughness may obscure pore size and locations in addition to pore size affecting surface roughness measurement. The line representing surface height including surface roughness 204 is distinctively longer than the line for the smoothed surface height 202. The difference in line length represents a one-dimensional slice of the increase in surface area due to surface roughness.

Surface roughness is a measure of the deviation of surface height from an ideal or average height. Surface roughness can be measured by several different parameters: $R_a$ (arithmetical mean deviation), $R_q$ (root mean squared deviation), etc. $R_a$ and $R_q$ as a function of surface height measurement z(x, y) for n measurements are defined in Equation 5 and 6 below.

$$R_a = \frac{1}{n}\sum_{i=1}^{n}|z_i| \qquad \text{Eq. 5}$$

$$R_q = \sqrt{\frac{1}{n}\sum_{i=1}^{n}z_i^2} \qquad \text{Eq. 6}$$

For a surface with pores, both $R_a$ and $R_q$ will over-calculate surface roughness when the mean surface height includes pores. Pores affect the average surface height—in graph 200 average surface height intersects the ideal surface height 202 but is smaller than the ideal surface height 202 outside of pores and larger than the ideal surface height 202 inside of pores. The average of surface heights is not the ideal surface height 202, and so $R_a$ and $R_q$ measure contributions from every point on the surface. Even the ideal surface height 202 itself, which is perfectly smooth when pores are accounted for, would produce nonzero $R_a$ and $R_q$ surface roughness. To measure local surface roughness, the contribution of pore size to surface roughness is subtracted.

Pore diameter is a petrophysical parameter of interest for reservoir surveying. Various pore diameters in rock are measured and quantified as a pore size distribution, which is used to evaluate ease of petroleum fluid extraction. Pore sizes are determined from measured NMR parameters; and measured NMR parameters can be obtained either in-situ—after downhole logging NMR logging measurements, either by openhole wireline logging measurement while drilling (MWD) or logging while drilling (LWD) operations—or measured in laboratory from cropped core plug samples or drill cuttings. Downhole measurements of the rock in its natural state can be improved by using parameters obtained during laboratory core or logging sample testing.

During NMR porosity measurements, $T_2$ relaxation time measures the interaction between hydrogen containing fluids and surfaces (i.e. surfaces of pores) for both free and entrapped fluids. When the surface inside of a pore is rough, there is more surface area for such fluid-rock interactions and NMR analysis, as illustrated by surface graph 200. $T_2$ relaxation time generates a measure of the surface area to volume ratio, rather than a direct measurement of pore volume. Smooth pore 206 and rough pore 208 are cross sections of idealized spherical pores with identical diameters d. The smooth pore 206 has a smaller surface area than the rough pore 208 and will consequently have a smaller SN ratio than rough pore 208. Thus, in pore distribution measured via NMR logging, these pores with equivalent diameters will not appear as a single distribution but rather give rise to a bimodal pore size distribution. Further, pores with equivalent surface to volume ratios where $S_1V_1=S_2/V_2$ such as small pore 210 and large pore 212 appear as a single pore size in the NMR pore distribution. The contribution of surface roughness to NMR pore distribution measurements are deconvolved to correlate physical porosity measurements to NMR porosity measurements.

The local surface roughness can be approximated from LCSM measurements using a dimensionless parameter L/W, where L corresponds to a height scale in the z direction orthogonal to the surface area and W corresponds to a width scale in the x or y direction along the surface. L/W can be defined as shown in Equations 7-11 below.

$$\frac{L}{W} = \frac{R_z}{R_{sm}} \quad \text{Eq. 7}$$

$$R_z = R_p + R_v = \text{Max}[z(x, y)] - \text{Min}[z(x, y)] \quad \text{Eq. 8}$$

$$R_p = \text{Max}[z(x, y)] \quad \text{Eq. 9}$$

$$R_v = |\text{Min}[z(x, y)]| \quad \text{Eq. 10}$$

$$R_{sm} = \frac{1}{n}\sum_{i=1}^{n} \Delta x_{si} = \frac{1}{n}\sum_{i=1}^{n} \sqrt{\Delta x_{si}^2 + \Delta y_{si}^2} \quad \text{Eq. 11}$$

Equation 7 shows that L/W is proportional to the ratio between the height of surface features and the distance between surface features, which are further defined in Equations 8-11. $R_z$ is the maximum height of the surface features, which is equal to the sum of the maximum peak height $R_p$ (height from sample average or zero to maximum) and the maximum valley depth $R_v$. Valley depth can be negative if $z=0$ is larger than the minimum sample depth (i.e. when $\text{Min}[z(x,y)]<0$), but $R_v$ is the absolute value of the height from valley depth and therefore positive. $R_z$, $R_p$, and $R_v$ can refer to universal maximum and minimum, but here refer to local maxima and minima where each local maxima represents a peak and each local minima represents a valley. $R_{sm}$ is the mean width of the profile elements, where $\Delta x_{si}$ is the distance in the x-direction between peaks or valleys. For a 3D surface height topology measurement, the distance between peaks (or valleys) is given by the parabolic equation for both $\Delta x_{si}$ and $\Delta y_{si}$ as shown in Equation 11. L/W can be defined using other equations, such as $R_{sq}$ instead of $R_{sm}$, as long as it relates height of surface deviations to width of surface deviations and does not rely on an average surface height or deviation from an average surface height.

The dimensionless parameter L/W, because it does not include an average or mean height calculation (unlike $R_a$ and $R_q$), more closely tracks surface irregularities while pore contributions are subtracted. Profile 214 depicts an example one-dimensional surface height measurement graph or trace. Average height 216 depicts the weighted average of surface height for the profile 214. Surface roughness can also be measured as $R_a$, $R_q$, or any other consistent roughness parameter. Hereinafter any instance of L/W, the dimensionless roughness parameter, can be substituted for any other roughness parameter and appropriate unit scaling. L/W has advantages over other roughness parameters, including for calculating effective surface relaxivity.

The physical phenomena measured by an idealized L/W are shown in pictographs 218, 220, and 222. The pictograph 218 illustrates a cross-section showing a "bump" or irregularity with width W and depth L projecting from the surface of a spherical pore. The pictograph 220 illustrates an idealized rectangular projection or "bump" from a surface, while the pictograph 222 illustrates an idealized cylindrical projection or "bump." Each geometry of the surface projection can be characterized by a width W and length L and the dimensionless parameter L/W, regardless of how the local surface roughness is shaped. Idealized "bump" shapes are not limited to these two approximations (cylindrical and rectangular), but realistic surface roughness irregularities can be approximated by idealized bumps in a variety of shapes.

For NMR data, an effective magnetic transfer coefficient can model the effect of surface roughness on surface relaxivity. Expressed as an "effective surface relaxivity" parameter as shown in Equation 12 for a cylindrical bump $$\rho\text{eff}=\rho(1+2R) \quad \text{Eq. 12}$$

R is the pore size effect corrected local surface roughness generated as disclosed herein. R is strongly dependent on L and W for local surface roughness "bumps" or irregularities but less dependent on the shape of the bumps, i.e. cylindrical vs. rectangular vs. another idealized shape. The L/W ratio is a good measurement parameter for local surface roughness because it can be related to the effective surface relaxivity such that the intrinsic surface relaxivity, p, and the surface roughness effect can be separately determined.

Figure 3:
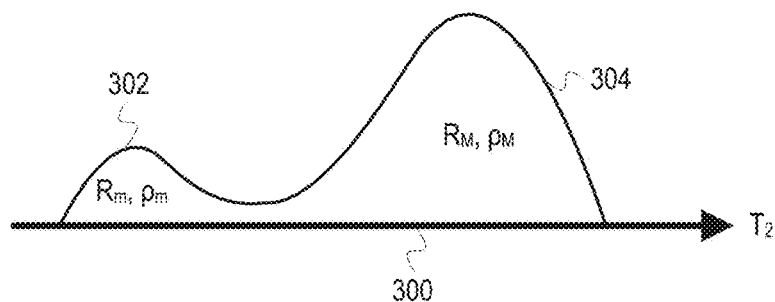
FIG. 3 illustrates the effect of surface roughness and surface relaxivity on bimodal pore size distribution estimation.
Figure 3:
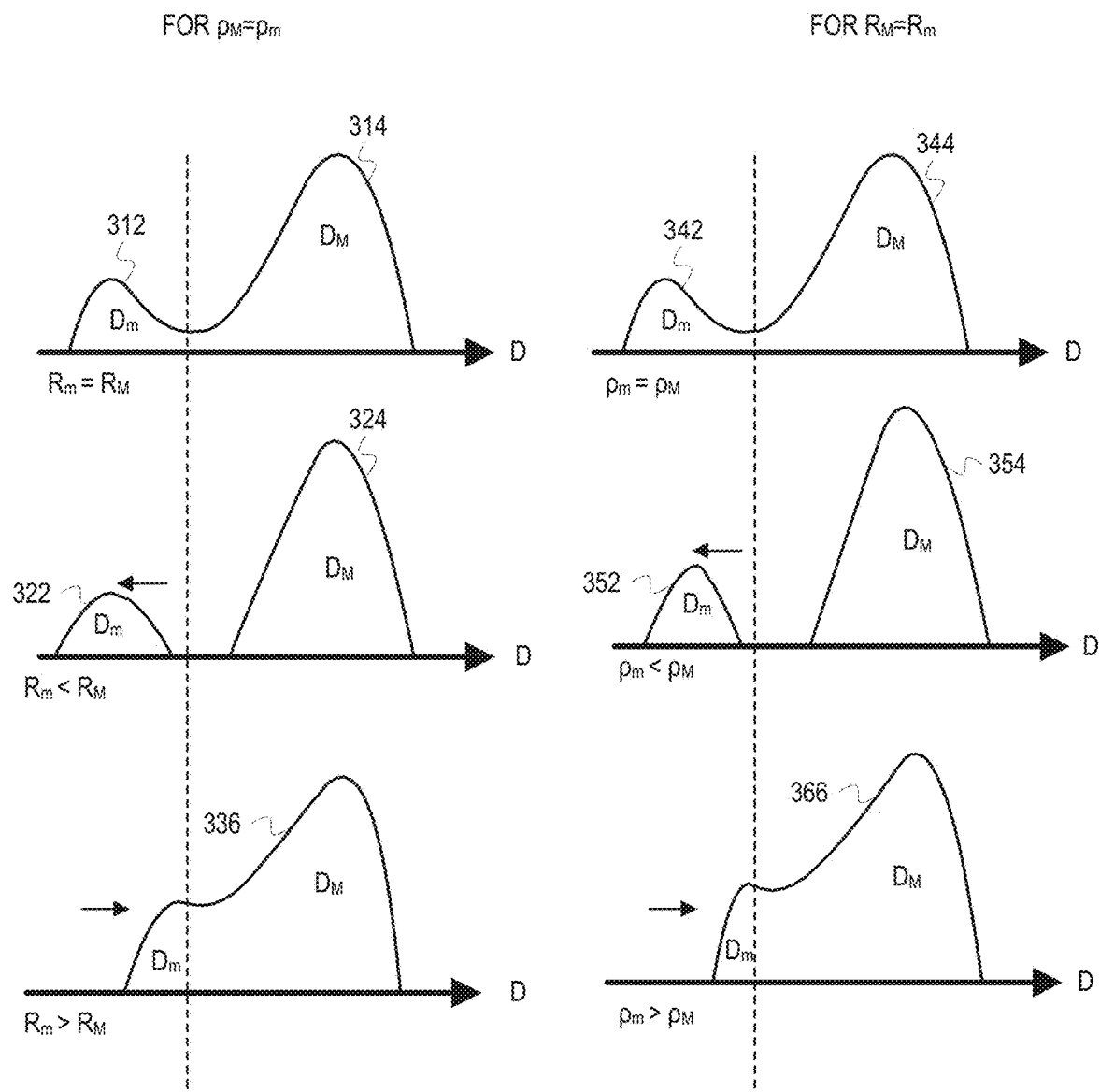

FIG. 3 illustrates the effect of surface roughness and surface relaxivity on bimodal pore size distribution estimation. Pictograph 300 represents a $T_2$ relaxation time distribution arising from an apparent bimodal pore size distribution. In order to calculate the pore size distribution from the $T_2$ relaxation time distribution, R (local surface roughness) and ρ for the micro-pore contribution 302 and the macro-pore contribution 304 are required. Two specific cases are described below. Bimodality can reflect truly multi-modal pore size distributions, or can arise due to bimodal surface roughness (perhaps due to presence of two of more mineral constituents) or other effects on NMR $T_2$ relaxation time.

Industry standards for calculating wettability rely on the Amott-Harvey and US Bureau of Mines methods, which are time-consuming laboratory methods that measure a bulk wettability for an entire plug and cannot be applied downhole. NMR downhole logging occurs in real time in the wellbore, and NMR logging measurements can produce wettability as a function of pore size. The most widely used wettability calculation based on NMR logging is the method of Looyestijn and Al-Muthana where a wettability index and fluid saturation are calculated as a function of pore size and where the pore-size distribution is calculated from 100% brine saturated data that assumes constant surface roughness and constant surface relaxivity for all pores. When local surface roughness varies inside of pores as a function of pore size (i.e. for the pore-size distribution) the wettability and saturation calculations are inaccurate. In particular, when the pore size distribution is bimodal or multi-modal and consists of both macro (or larger) pores and micro (or smaller) pores with disparate local surface roughness, surface relaxivity varies greatly over the pore size distribution.

$T_2$ relaxation time is related to the SN ratio, which is related to pore size. When local surface roughness is present inside of pores, the spherical body model underestimates the pore side (i.e. $d_{calc} < d_{actual}$) which impacts the Looyestijn inversion. By including a surface roughness corrected relaxivity (as shown in Equation 13) the pore size derivation from NMR data accounts for local surface roughness inside pores and produces accurate estimates of pore size(s).

$$D = 6\rho(1+2R)T_{2s} \quad \text{Eq. 13}$$

D is the calculated pore diameter for rough pores, p accounts for the interaction strength between the fluid and the solid surface, and 1+2R term accounts for pore geometry (i.e. this factor will depend on R but forms based on pore geometry approximation).

For a pore size distribution that is bimodal or multi-modal with macro and micro pores experiencing different local surface roughness, local surface roughness and surface relaxivity for both groups of pores can be accounted for. For small pores with local surface roughness $R_m$ and surface relaxivity $\rho_m$ and large pores with local surface roughness $R_M$ and surface relaxivity $\rho_M$ as depicted in FIG. 3, the relaxation rate is given by Equation 14 for small pores and Equation 15 for large pores.

$$\frac{1}{T_{2S}} = \rho_m \frac{S_m}{V_m} \quad \text{Eq. 14}$$

$$\frac{1}{T_{2S}} = \rho_M \frac{S_M}{V_M} \quad \text{Eq. 15}$$

Equation 14 and Equation 15 give rise to the dual humps representing a bimodal distribution in the pore size distributions shown in FIG. 3.

For spherical pores when surface roughness is not included, the relationship shown in Equation 16 holds and the spherical pore size for micro-pore $d_m$ is given by Equation 17 while the spherical pore size for macro-pores $d_M$ is given by Equation 18.

$$\frac{6}{d} = \frac{S}{V} \quad \text{Eq. 16}$$

$$d_m = 6\rho_m T_{2S} \quad \text{Eq. 17}$$

$$d_M = 6\rho_M T_{2S} \quad \text{Eq. 18}$$

The corrected for surface roughness pore size diameter D is then given by Equation 19 (for micro pores) and Equation 20 (for macro pores). The character D is also used in the art to refer to diffusivity or the diffusion coefficient, but hereinafter D will refer exclusively to the surface-roughness-corrected pore size diameter.

$$D_m = 6\rho_m(1+2R_m)T_{2s} \quad \text{Eq. 19}$$

$$D_M = 6\rho_M(1+2R_M)T_{2s} \quad \text{Eq. 20}$$

In the case where $\rho_m = \rho_M$ (as would be the case if the micro and macro pores result from the same mineralogy) as depicted in FIG. 3, the pore-size distribution is a distortion of the $T_2$ distribution when $R_m \neq R_M$. If $R_m = R_M$ (as would occur when the pores have the same surface roughness), the pore size distribution can be calculated directly from the $T_2$ distribution. Micro-pore distribution 312 in the pore size distribution mimics the micro-pore contribution 302 in the $T_2$ relaxation time distribution, while macro-pore distribution 314 mimics the macro-pore contribution 304 in the $T_2$ relaxation time distribution. If $R_m < R_M$, the pore size distribution calculated directly from the $T_2$ distribution artificially underestimates the size of the micro pores—that is micro-pore distribution 322 and macro-pore distribution 324 are artificially separated as the diameter of the micro-pore is underestimated. If however $R_m > R_M$, the pore size distribution calculated directly from the $T_2$ distribution artificially overestimates the size of the micro pores. Pore size distribution 336 is an amalgamation of the micro-pore distribution and the macro-pore distribution. By including the local surface roughness, determination of pore size distribution can be improved.

In the case where $R_m = R_M$ (i.e. when micro and macro pores have the same local surface roughness) as also depicted in FIG. 3, the pore size distribution is a distortion of the $T_2$ distribution whenever $\rho_m \neq \rho_M$. When $\rho_m = \rho_M$ (as would occur when micro and macro pores have the same mineralogy), micro-pore distribution 342 mimics the micro-pore contribution 302 in the $T_2$ relaxation time distribution, and macro-pore distribution 344 echoes the macro-pore contribution 304. If $\rho_m < \rho_M$, the diameter of the micro pores will be underestimated and micro-pore contribution 352 will correspond to an artificially small pore diameter in the pore size distribution further from macro-pore contribution 354. If $\rho_m > \rho_M$, the diameter of the micro pores will be overestimated, relative to the diameter of the macro pores in the pore size distribution. In this case, pore size distribution 366 reflects micro pore sizes closer than actual to macro pore sizes. Again, including local surface roughness in pore size distribution calculations improves such calculations and avoids these effects.

Figure 4:
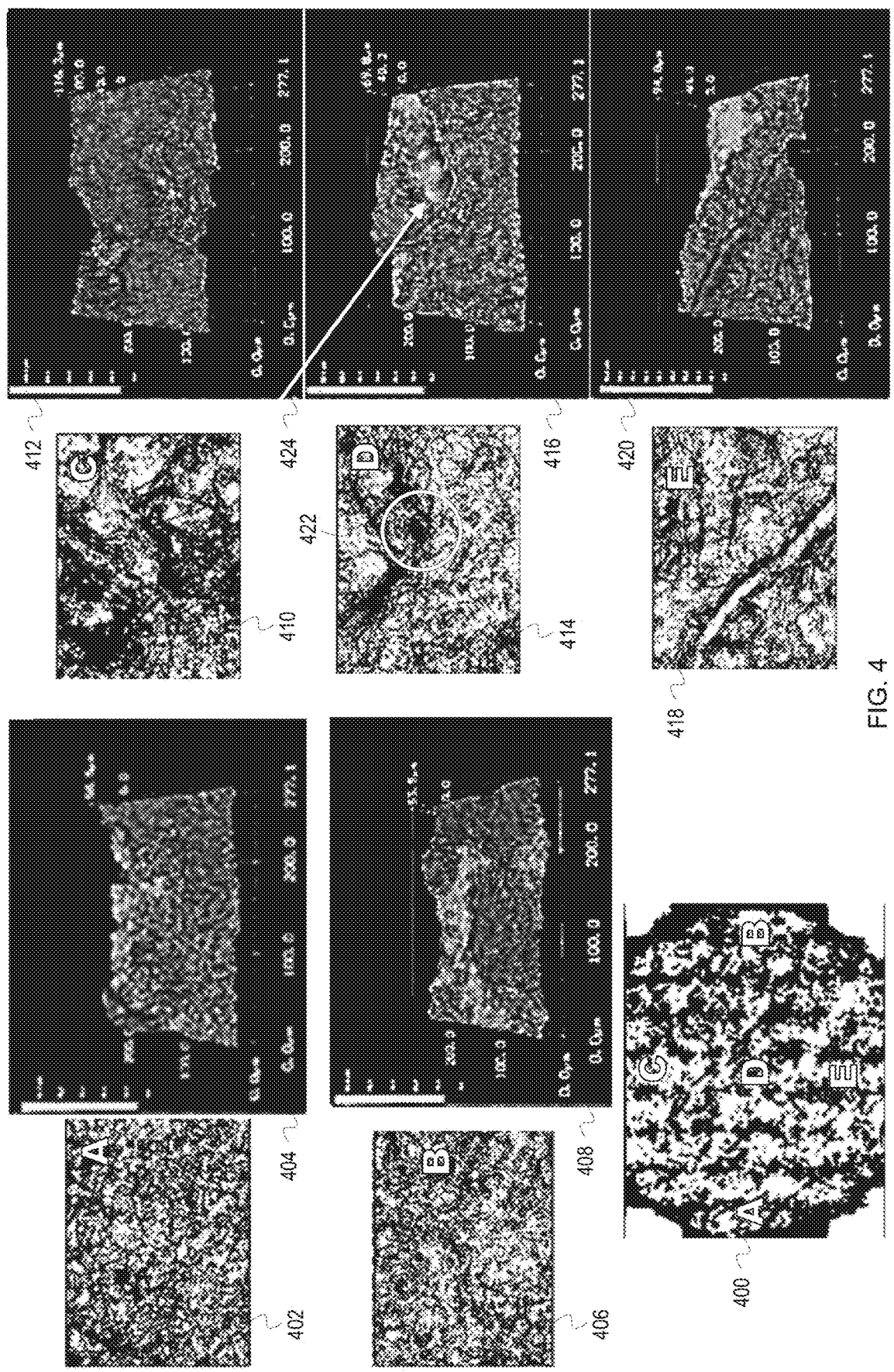
FIG. 4 depicts example two-dimensional and three-dimensional laser confocal scanning microscopy (LCSM) imaging for from a core sample.

FIG. 4 depicts example two-dimensional and three-dimensional LCSM imaging from a core sample. Photograph 400 shows a black and white image of a core sample in cross-section. Locations marked A, B, C, D, and E indicate regions which were scanned to produce LCSM images. The black areas of photograph 400 correspond roughly to saw marks or striations in the cross-section of the core sample. Two-dimensional LCSM image 402 and three-dimensional LCSM image 404 were obtained from area A as shown in photograph 400. Two-dimensional LCSM image 406 and three-dimensional LCSM image 408 were obtained from area B as shown in photograph 400. Two-dimensional LCSM image 410 and three-dimensional LCSM image 412 were obtained from area C as shown in photograph 400. Two-dimensional LCSM image 414 and three-dimensional LCSM image 416 were obtained from area D as shown in photograph 400. Two-dimensional LCSM image 418 and three-dimensional LCSM image 420 were obtained from area E as shown in photograph 400.

LCSM images are displayed in black and white, but can be full color images. Each image represents a measure of surface height, with black representing the deepest areas while white represents the highest areas. Deep depressions or the bottom of pores can be out of the field of view.

LCSM images image surface height creating a three-dimensional topological map of the surface with resolution from 10 to $10^{-1}$ μm (micron or $10^{-6}$ meter). Stylus pen microscopy typically resolves surface features in the mm (millimeter or $10^{-3}$ meter) to 10s of μm range through mechanical contact. X-ray diffraction microscopy uses far-field scattering of coherent X-rays to generate two-dimensional or three-dimensional images with nanometer ($10^{-9}$ meter) or smaller resolution. Atomic force microscopy (AFM) images surface topology at near atomic or Angstrom (Å or $10^{-10}$ meter) level resolution. Each of these methods also has a corresponding limit to field of view (FOV), which is the total surface areas that can be imaged at one time. In general, as resolution increases FOV decreases. Further, for high-resolution imaging data acquisition times increase quickly as image sizes increase and can be prohibitively long.

Imaging porous rock surface for local surface roughness requires resolution of features substantially smaller than pore sizes—for instance, at least one order of magnitude smaller than a pore diameter approximate size—where the pore diameter is approximated as corresponding to the eightieth percentile pore volume in the pore size distribution. In order to correctly deconvolve local surface roughness from pore size contributions, FOV or image size should include multiple pore spaces. For example, for carbonate rocks with granularity in the 1-10 μm range a FOV at least 10 μm by 10 μm or larger includes enough intergranular pores to identify pores based on such an image and subtract them in order to generate local surface roughness measurements. Further, because carbonates and other sedimentary rocks are heterogeneous, multiple areas are imaged in order to determine a representative sample image. LCSM provides images with the resolution and FOV necessary to deconvolve porosity and local surface roughness quickly, accurately, and in a cost-effective manner.

Sample testing and measurement allows determination of optimal LCSM image resolution and size based on rock characteristics. Sample measurement customization and optimization will also be discussed in more detail in reference to FIGS. 9 and 10. Several sites are sampled and imaged because many rock types (i.e. carbonates) are highly heterogeneous.

2D (two-dimensional) LCSM images monitor sample preparation, as well as surface height. Particulates and dust are visible on black and white 2D images. Crystalline aggregates are reflective, while dust obscures the reflectivity of the crystalline portions of the rock. Samples can be recleaned to remove dust. 3D (three-dimensional) LCSM images produce easily recognizable and identifiable pore imaging. For particularly deep or narrow pores, the bottom of the pore may not be imaged. The depth of the deepest pores at the limits of measurement will bottom out the LCSM imaging. Filtering is used to remove areas of LCSM imaging, such as those at the bottom of deep pores, from local surface roughness calculation. Further filtering will be discussed in regard to FIG. 8. Further, certain profiles or projections on the surface will block the light necessary for LCSM imaging. Any gaps or blind spots where light cannot reach and image will also be filtered out, as will also be discussed in reference to FIG. 8.

The 2D LCSM image 402 obtained at site A of photograph 400 and the 2D LCSM image 406 obtained at site B of photograph 400 both show regular granularity and pores for calculation of local surface roughness. The 3D LCSM image 404 and the 3D LCSM image 408 show three-dimensional roughness including both local surface roughness and pore contributions.

The 2D LCSM image 410 obtained at site C shown in photograph 400 shows several dark crystal grains in the upper half of the image. Imaging over crystal grains and grain boundaries may not produce accurate local surface roughness. For sedimentary rocks that contain large amounts of crystalline or other particulates, local surface roughness can have bimodal or multi-modal distribution where mineralogy effects local surface roughness. For some aggregates with low reflectivity, LCSM imaging incompletely maps surface topology because not enough light is reflected. Additional sample areas may be selected for imaging if reflectivity is too low and such aggregates are not predominant in other areas. The 3D LCSM image 412 shows surface topology can be obtained for dark or less reflective crystal particulates.

The 2D LCSM image 414 obtained at site D shown in photograph 400 shows a deep hole surrounded by circle 422 where light cannot reach all features. This deep irregularity also appears on the 3D LCSM image 416 (identified by arrow 424).

The 2D LCSM image 418 obtained at site E shown in photograph 400 includes a diagonal line that is visible in the 3D LCSM image 420 as a ridge or projection. For young carbonates, fossil contributions can produce topologic irregularity. Small irregularities can be removed through filtering. For large or persistent irregularities in an imaged area, another area is selected for measurement.

Figure 5:
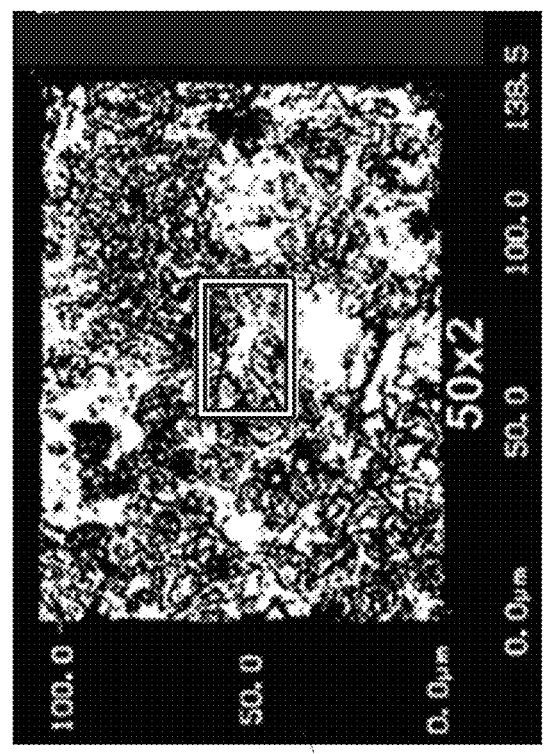
FIG. 5 depicts the effects of magnification on surface roughness measurements.
Figure 5:
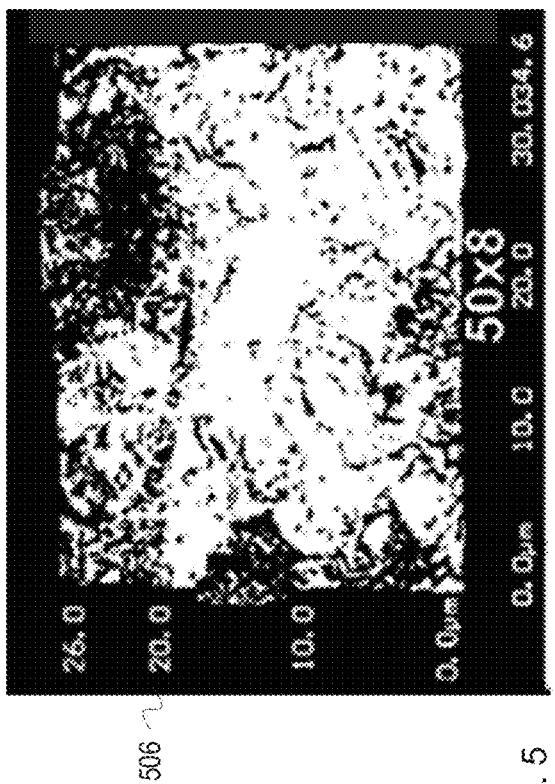
Figure 5:
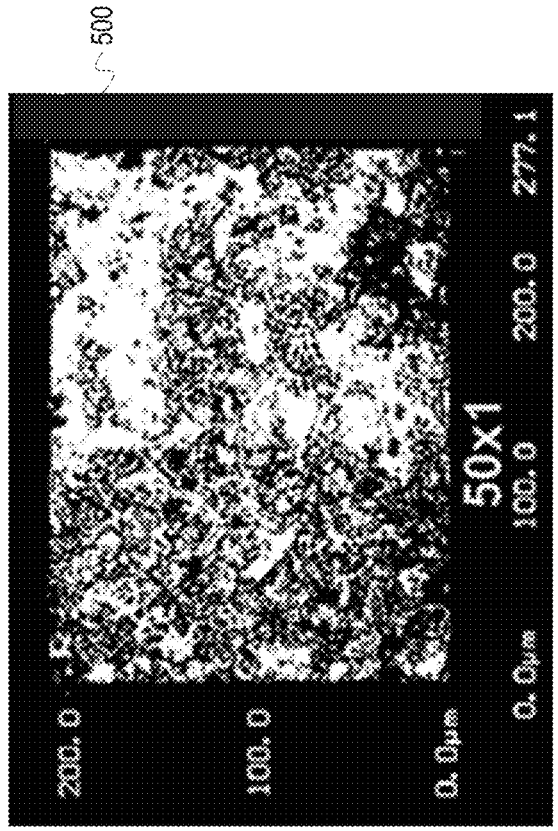
Figure 5:
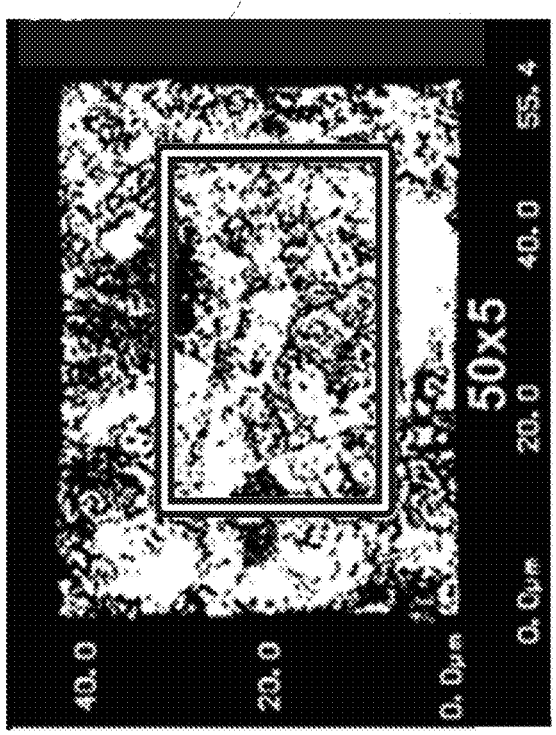

FIG. 5 depicts the effects of magnification on surface roughness measurements. Magnification is the lens magnification multiplied by the zoom magnification. Each image is acquired at the given magnification—the zoom is not a digital interpolation filter acting on a single acquired image but rather an additional physical lensing magnification. Image 500 is acquired at a 50×1 magnification. Image 502 was acquired at a 50×2 magnification. Image 504 is acquired at 50×5 magnification. Image 506 is acquired at 50×8 magnification. All images are acquired in the same area over the same features, but magnification effects the appearance of features. The feature in a box in the image 502 is also included in a box 504 in the image 504 at a larger magnification.

Table 1 identifies resolution and surface roughness calculations as a function of magnification.

TABLE 1

Surface roughness as a function of magnification.

| Lens × Zoom | Resolution (nm/pixel) | $R_a$ (μm) | $R_q$ (μm) | L/W |
| --- | --- | --- | --- | --- |
| 50 × 1 | 270 | 0.85 | 1.52 | 1.70 |
| 50 × 2 | 135 | 0.87 | 1.53 | 2.41 |
| 50 × 5 | 54 | 0.86 | 1.52 | 2.78 |
| 50 × 8 | 23 | 0.86 | 1.52 | 3.05 |

LCSM measures a surface height as a function of location, i.e. height=Z (x, y) where Z is the surface point at height (x, y). The calculation of surface roughness and local surface roughness is complicated by the presence of pores—there is no flat baseline from which to calculate height deviation and even a running average will overestimate roughness at the edges of pores. Because the pore length scale, which can be approximated as $r_{pore}$ for spherical pores, is significantly larger than local surface roughness, pore contributions can be filtered out of surface roughness measurements. The applied filter, such as a Gaussian filter of Equation 21, selects features on the pore length scale while ignoring features on the smaller scale of the local surface roughness.

$$G(x) = \frac{1}{\sigma\sqrt{2\pi}} \text{Exp}\left[-\frac{(x-\mu)^2}{2\sigma^2}\right] \qquad \text{Eq. 21}$$

The filter parameter σ selects the pore sized features to filter out from the surface height measurements.

As provided by convolution theory, multiplying the Fourier transform of the Gaussian filter by the original surface roughness profile produces the Fourier transform of the convolution of the Gaussian and the surface roughness profile. The difference between the convolution filtered surface roughness profile and the original surface roughness profile is the pore-size-filtered surface roughness, or local surface roughness, as shown in the graph 110 in FIG. 1 for a 10 µm Gaussian filter.

Figure 6:
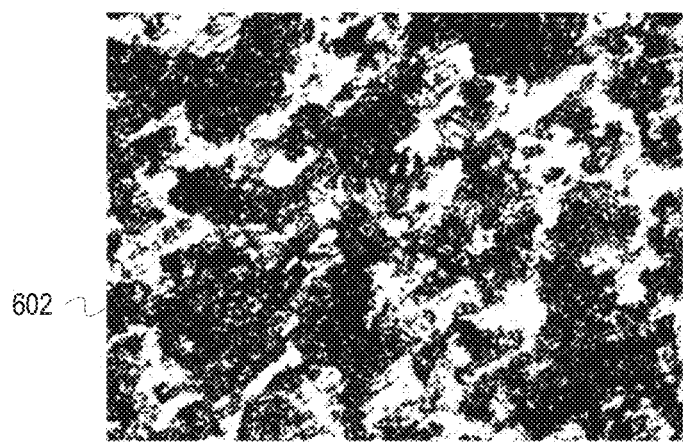
FIG. 6 illustrates the effect of saw marks on sample surface
Figure 6:
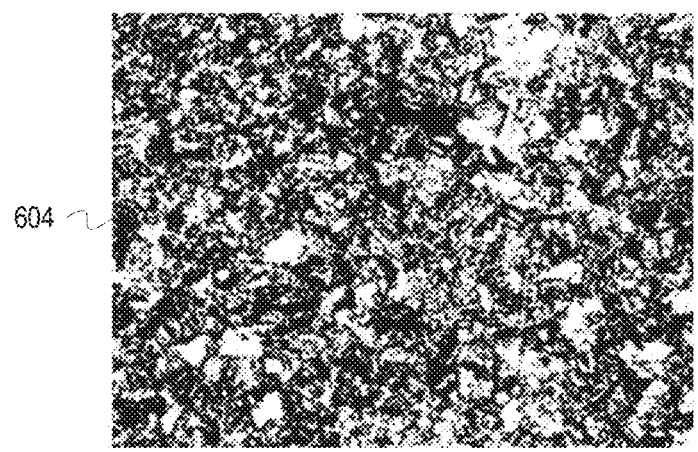

FIG. 6 illustrates the effect of saw marks on sample surface. Surface roughness measurements are affected by the way the sample was prepared. For hard rocks, distinctive saw marks can obscure or reduce local surface roughness and pore distribution. Photograph 602 shows a hard rock sample with distinctive diagonal saw marks from coring. The sample in the photograph 602 produces a measured mean roughness value of R=1.4±0.2. Photograph 604 shows a portion of the same rock sample that has been broken into pieces after coring. The measured surface roughness for the sample in the photograph 604 is R=2.5±0.2. The increase in surface roughness reflects that surface roughness was reduced by the saw marks. For smaller saw marks, an image filter or edge detector such as a Hough transform filter identifies saw marks excludes areas with saw marks from surface roughness calculations. If saw marks are dominant over significant portions of the sample surface, the sample is broken and another area imaged.

Surface roughness effects several petrophysical parameters of interest, in addition to NMR $T_2$ relaxation time. Wettability, permeability, and mineral identification are measurable parameters dependent on surface roughness. Calculating local surface roughness improves reliability of these measurements.

Surface roughness effects contact angle, as identified in Wenzel's theorem detailed in Equation 22.

$$\cos\theta_A = (S_{dr}+1)\cos\theta \qquad \text{Eq. 22}$$

$S_{dr}$ is the interfacial area ratio parameter of Equation 3, $\theta_A$ is the apparent contact angle, and θ is the intrinsic contact angle. The intrinsic contact angle θ is the contact angle for a perfectly smooth surface. As described by Wenzel's theorem, surface roughness enhances wettability. For a hydrophilic surface with θ<90°, the surface becomes more hydrophilic (i.e. $\theta_A$ decreases as water is drawn across the surface) when $S_{dr}$>0. For hydrophobic surfaces where θ>90°, surface roughness increases hydrophobicity. That is, $\theta_A$>0 when $S_{dr}$>0. For very hydrophobic surfaces, OA is limited by the extreme bounds of the cosine function.

Wettability is determined by measuring the contact angle between a solid smooth surface of a material and a drop of water. A surface with pores is not a solid smooth surface. Generating a local surface roughness that excludes pore effects allows wettability to be calculated based on $S_{dr}$.

Local surface roughness can also determine or aid in determining mineralogy, especially for heterogeneous carbonates. A change in local surface roughness can indicate that bimodal or multimodal surface relaxivity or contact angle is appropriate. An appropriate relaxivity can be calculated without an exact identification of the minerals giving rise to a multimodal distribution, as long as local surface roughness is measured. For example, 2D image 402 and 2D image 406 of FIG. 4 correspond to calcite mud, while 2D image 410 displays dolomite crystals. The calcite mud of sites A and B exhibits greater local surface roughness than the crystals located at site C of photograph 400.

Figure 7:
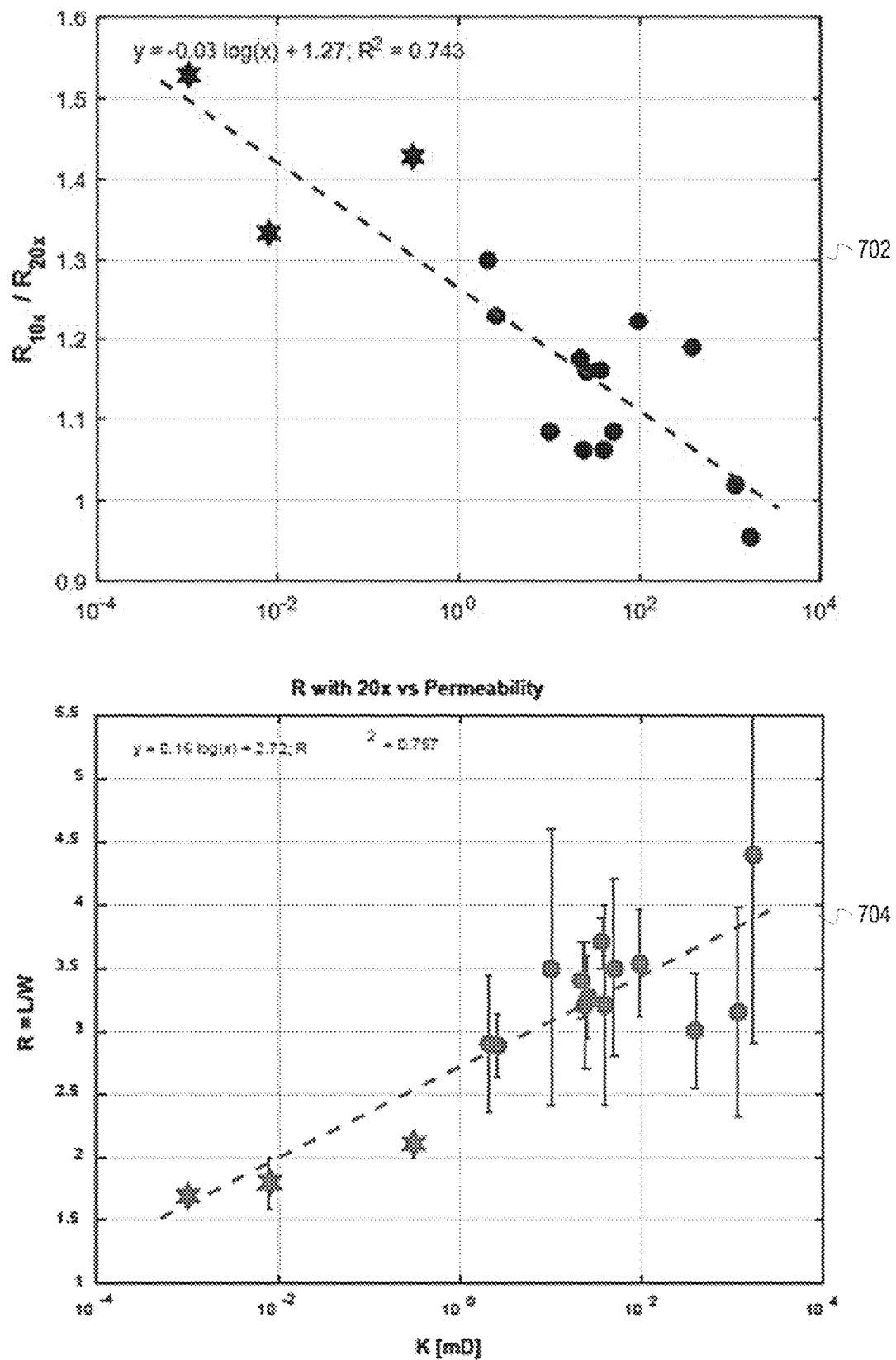
FIG. 7 depicts the relationship between permeability and local surface roughness.

FIG. 7 depicts the relationship between permeability and local surface roughness. Permeability is also correlated to local surface roughness. The relationship between permeability and local surface roughness also depends on the resolution at which the image was taken—i.e. correlations are pixel resolution dependent. Graph 702 depicts the relationship between permeability and the ratio of $R_{10\times}$ to $R_{20\times}$. $R_{10\times}$ is the local surface roughness L/W at a magnification of 10, while $R_{20\times}$ is the local surface roughness L/W at a magnification of 20. While L/W is used in the graph 702, another local surface roughness parameter (such as $R_a$ or $R_q$) can also be used. Graph 704 correlates R=L/W at a magnification of 20 directly to permeability.

FIG. 8A is a flowchart of example operations for filtering out estimated pore size contribution to quantify intrinsic surface roughness. The operations are described as being performed by an image processor. However, program code naming, organization, and deployment can vary due to arbitrary programmer choice, programming language(s), platform, etc. The image processor can be program code that quantifies surface roughness or an image processing program that includes or invokes the program code for quantifying surface roughness.

At block 802, the image processor or controller identifies a pore size length scale(s) based on surface height measurements of a formation sample (e.g., core sample). The surface height measurements can be 2D-based (e.g., surface height profile z(x)) or 3D-based (e.g., surface topology map z(x, y)) measurements from data acquired by LCSM or another imaging or scanning methodology. The group of surface height measurements is hereinafter referred to as a surface height map, whether the surface height is measured as a function of one axis as z(x) or two axes as z(x, y). Pore size is deconvolved from the surface height map by identifying two or more length scales over which the surface height varies, such as through a Fourier transform or frequency analysis, and by associating a longer length scale variations with the pore size length scale. In some embodiments, the image processor determines pore size length scale, $r_{pore}$, with other measurements such as mercury porosity and NMR diffusivity measurements on sister samples (i.e., lithologically similar samples, usually cut from the same core plug, or from the a core at the same depth) from the same formation sample, as will be discussed in reference to FIG. 10. In some embodiments, the controller selects the pore size length scale based on previous imaging of similar rock types or from a library or look up table.

At block 804, the image processor generates a pore feature map based on filtering the surface height map based on the determined pore size length scale(s). The variations in the surface height map on the pore size length scale represents the features (e.g., pore depth and width) of pores in the surface of the formation sample. The filter can be a Gaussian, as shown in Equation 6, or another filter that selects changes in surface height on the order of the identified pore size length scale. Filtering out the surface height changes below/smaller than the pore size length scale removes surface height variations attributable to local surface roughness. The surface height map can be filtered in the surface height or topology domain (i.e. where surface height is z(x,y)), or the image that corresponds to surface height can be filtered in the pixel or image intensity domain.

For samples with bimodal or multi-modal pore size distributions, an individual pore feature map can be generated for each pore length scale and then the individual pore feature maps aggregated into the pore feature map. The controller can select/use a filter for each determined pore size length scale. In this case, the total pore feature map can be an overlay or other union of the multiple pore size length scale pore feature maps. The processor can validate this pore feature map with expected pore distribution, either from a measured sample or from a reference table or library. If the pore distribution of the pore feature map is outside a specified margin of deviation greater or lower than expected pore distribution, the image processor can adjust the filtering parameters, select a new area for surface roughness measurement, or determine that a bimodal or multi-modal pore size filter be used or that an additional pore size length scale be determine and a corresponding filter be added.

At block 808, the image processor subtracts the pore feature map from the acquired surface height map of the formation sample (e.g., acquired topology data or surface height measurements). The subtraction can be performed at each data point, via a convolution, in Fourier transform space as a function of frequency, etc. The subtraction of the pore feature map can be considered subtracting or removing the pore size contribution from the surface roughness. The subtraction or removal generates a pore corrected surface height map.

At block 810, the image processor refines the pore corrected surface height map. This operation is depicted in a dashed box to indicate that embodiments may or may not perform the operation(s) represented in block 810. The image processor checks the pore corrected surface height map to remove any edge effects where the pore corrected surface height contained in the pore corrected surface height map is underestimated or overestimated. The pore size filter may incorrectly average near the edges of a sample or the edges of a window of surface height map to which it is applied. A pore size filter including a running average over multiple data points misbehaves near the edge unless the sampling window is adjusted. The pore size filter can be corrected for edge effects, or the pore size corrected surface height map can be generated based on a smaller sampling window that excludes edge effects.

At block 816, the image processor identifies any modalities or distributions in surface roughness. The processor can identify the frequency of surface roughness in order to identify modalities. The processor can also calculate surface roughness in windows over the sample and identify any change in surface roughness magnitude, such as those that would correspond to crystalline grain boundaries, present in the image or surface height map. If the surface roughness is bimodal or multi-modal, flow continues to block 818. If the local surface roughness has a single mode, flow continues to block 822.

At block 818, for a bimodal or multi-modal surface roughness distribution the image processor calculates multiple values or ranges of surface roughness and/or dimensionless surface roughness. The image processor identifies or tags regions of the sample corresponding to each of the values or ranges of surface roughness. The surface roughness can be expressed as dimensionless parameter L/W, $R_a$, $R_q$, or another appropriate measurement parameter for each of the surface roughness modes. Surface roughness quantified based on the pore corrected surface height map represents the local surface roughness for a surface height map from which the porosity contribution has been subtracted. Quantifying surface roughness as $R_a$ or $R_q$ involves the calculation of an average surface height before deviations from the mean can be calculated. In order to accurately calculate a mean, the sample surface should be perfectly horizontal. If the surface is not horizontal, a filter first is applied to transform the surface height measurements where the measured surface height is projected onto the horizontal plane. Calculating the local surface roughness as dimensionless parameter L/W involves a running tabulation and does not require a horizontal sample surface. The relationships shown in Equations 7-11 may be used, or other analogous measures of L/W. In some embodiments, calculation of a horizontal plane projection can be optionally included in the refinement of the pore corrected surface height map at block 810.

At block 822, the image processor quantifies surface roughness based on the pore corrected surface height map for a single mode. The surface roughness can be expressed as dimensionless parameter L/W, Ra, Rq, or another appropriate measurement parameter. Surface roughness quantified based on the pore corrected surface height map represents the local surface roughness for a surface height map from which the porosity contribution has been subtracted. Quantifying surface roughness as Ra or Rq involves the calculation of an average surface height before deviations from the mean can be calculated. The sample surface should be perfectly horizontal, and if the surface is not horizontal, a filter is applied to transform the surface height measurements by projecting the measured surface height onto the horizontal plane. Calculating the local surface roughness as dimensionless parameter L/W involves instead a running tabulation—the relationships shown in Equations 7-11 may be used, or other analogous measures of L/W. In some embodiments, calculation of a horizontal plane projection can be optionally included in the refinement of the pore corrected surface height map at block 810.

FIG. 8B is a flowchart of example operations for determining pore size distribution based on surface roughness filtered to exclude pore size contribution. Determination of pore size distribution from NMR $T_2$ distribution relies directly on dimensionless surface roughness, calculated as shown in block 818 or 822 of FIG. 8A and by Equations 7-11.

At block 824, the image processor corrects surface relaxivity based on the dimensionless surface roughness. The relationship between surface relaxivity and dimensionless surface roughness is given by Equation 12 or another similar equation for a give pore geometry approximation. For multi-modal surface roughness distributions, the processor corrects a surface relaxivity for each distribution.

At block 826, the image processor determines the pore size distribution based on the dimensionless surface roughness and the corrected surface relaxivity. The processor calculates a pore size distribution from $T_1$ or $T_2$ relaxation times, accounting for surface roughness inside of pores by using the dimensionless surface roughness and the corrected surface relaxivity as shown in Equations 17-20. For multi-modal surface roughness distributions, the processor determines a pore size distribution based on surface roughness and corrected surface relaxivity for each distribution.

FIG. 8C is a flowchart of example operations for determining mineralogy features. The image processor optionally identifies mineralogy based on a pore size corrected surface height map generated at block 808 or 810 of FIG. 8A. The image processor can identify mineral content based on knowledge of expected surface roughness of constituent particles from a look up table or reference or based on expected rock composition. Machine-learning or other artificial intelligence may correlate surface roughness to mineral composition. For carbonates and other sedimentary rocks, surface roughness for constituent minerals is known and aids in identifying weathering and post-depositional evolution of the rock and constituent parts. The processor may also identify areas of surface height map that correspond to each mineral.

At block 830, the image processor determines mineralogy and lithology features for each identifies constituent material—i.e. the processor determines surface roughness for each mineral constituent based on areas of the pore size corrected surface height map corresponding to a given mineral. Lithological features include surface roughness, pore size feature length, surface relaxivity, pore size distribution, etc., which are influenced by mineralogy or mineral composition. Areas of the pore corrected surface height map corresponding to a given mineral composition can display multi-modal surface roughness distributions and/or pore size distributions.

Figure 9:
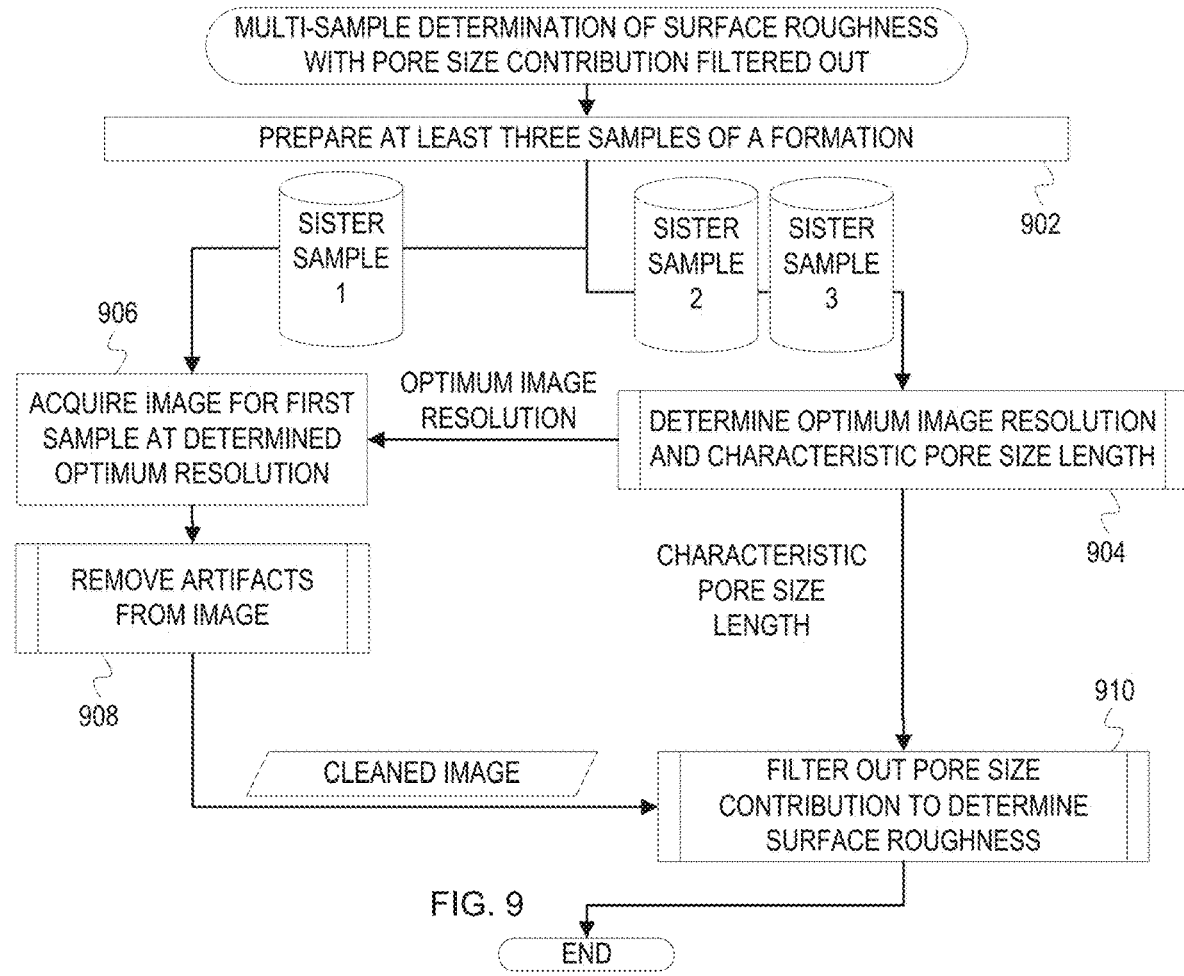
FIG. 9 is a flowchart of example operations for multi-sample determination of surface roughness measurement.

FIG. 9 is a flowchart of example operations for multi-sample determination of surface roughness measurement. The image processor determines the optimal image resolution based on processing of sister samples, obtains the surface height measurement or image, and readies the acquired image for calculation of the surface roughness as depicted in FIG. 8.

At block 902, at least three samples of a core sample from a formation are prepared for testing and measurement. One sample, Sister Sample 1, is prepared for measurement by the image processor to determine a surface height map. Two other samples, Sister Sample 2 and Sister Sample 3, are prepared for measurement by other means in order to determine the optimal image resolution for the image processor. Of the sister samples, one sample is prepared for measurement via NMR imaging for pore body size measurement, and one sample is prepared for measurement via capillary pressure testing for pore throat or pore size physical measurement At block 904, one sample (Sister Sample 2) measured for NMR relaxation time distribution measurement or other method of calculating apparent pore body size. NMR measurements result in approximate pore body size measurements given in terms of SN, where the surface roughness contribution to pore surface area is not accounted for. An NMR processor or operator calculates an estimated pore volume size based on S/V ratio and $T_2$ relaxation time, from the NMR measurements. The apparent pore volume size estimates the size of the pore body. Based on the apparent pore volume size, an estimated pore size characteristic length is calculated based on Equations 1 and 2 and similar (where $V \sim r^3$). The image processor of FIG. 8 can use estimated pore size characteristic length derived from NMR measurements as a first guess or iteration when calculating the pore size characteristic length based on the surface height map.

An additional sample (Sister Sample 3) is tested for capillary pressure testing or any other method of testing that measures pore throat size. Pore throat size measures the radius of the area available for fluid transport between larger pore volumes, i.e. the flow limiting bottleneck or smallest diameter of flow. $P_c$, capillary pressure, strongly correlates with wettability. Apparent capillary pressure is measured via a porous diaphragm, via a centrifugal method, via mercury injection, via a dynamic capillary pressure method, or via any other appropriate method. A processor or operator calculates an apparent pore throat size or pore size distribution based on the measurement of mercury injection capillary pressure. The processor can use the apparent pore throat size as a minimum bound for the pore size length scale—the pore size length scale should be larger than its minimum radius which is given by the pore throat size.

Measuring both S/V via NMR and pore throat size provides an estimate and bound for the pore size characteristic length. The image processor then acquires an image resolved to at least an order of magnitude smaller than the estimate pore size characteristic length. The image processor also acquires an image large enough that the image's field of view (FOV) includes multiple pores. FOV size and image resolution are roughly inversely proportional, while image resolution increases with magnification or zoom (where zoom power is a measure of magnification). The image processor determines a minimum FOV based on the estimated pore size distribution or S/V distribution determined via NMR imaging. The processing of sister samples generates an optimum range for image resolution for use when acquiring the surface height map.

Further, pore throat size distribution and $T_2$ distribution both provide indications that pore size distribution may be multi-modal. When a multi-modal pore size distribution is indicated, but not evident in the surface height map the image processor can select a new area of the sample for imaging.

At block 906, the image processor or controller acquires an image or surface height map for the first sample (Sister Sample 1) at the determined optimum resolution. The optimum resolution based on the measurement of the sister samples can be further adjusted based on surface height maps, pore size characteristic lengths determined from surface height maps, surface roughness calculations, or dimensionless surface roughness, i.e. optimum resolution can iteratively change as the processor gathers new information about the sample.

The image processor also determines optimum resolution based on dimensionless surface roughness L/W. Measurements of surface roughness vary based on resolution—a surface height map that contained only one point would be perfectly smooth. The image processor determined an optimum resolution fine enough such that calculations of L/W approach the actual value but coarse enough that image acquisition time is reasonable, i.e. such that the number of surface height measurements acquired cannot be reduces without artificially decreasing L/W.

At block 908, the processor removes artifacts from the image. The acquired image or surface height map is checked for artifacts and inconsistencies as will be detailed in reference to FIG. 10. Small areas of artifacts are removed to produces a cleaned image, or a new area is selected.

At block 910, the image processor filters out the pore size contribution to determine surface roughness, as shown in FIG. 8. The image processor filters out the pore size characteristic length based at least initially on the estimate pore size characteristic length from Sister Samples 2 and 3.

Figure 10:
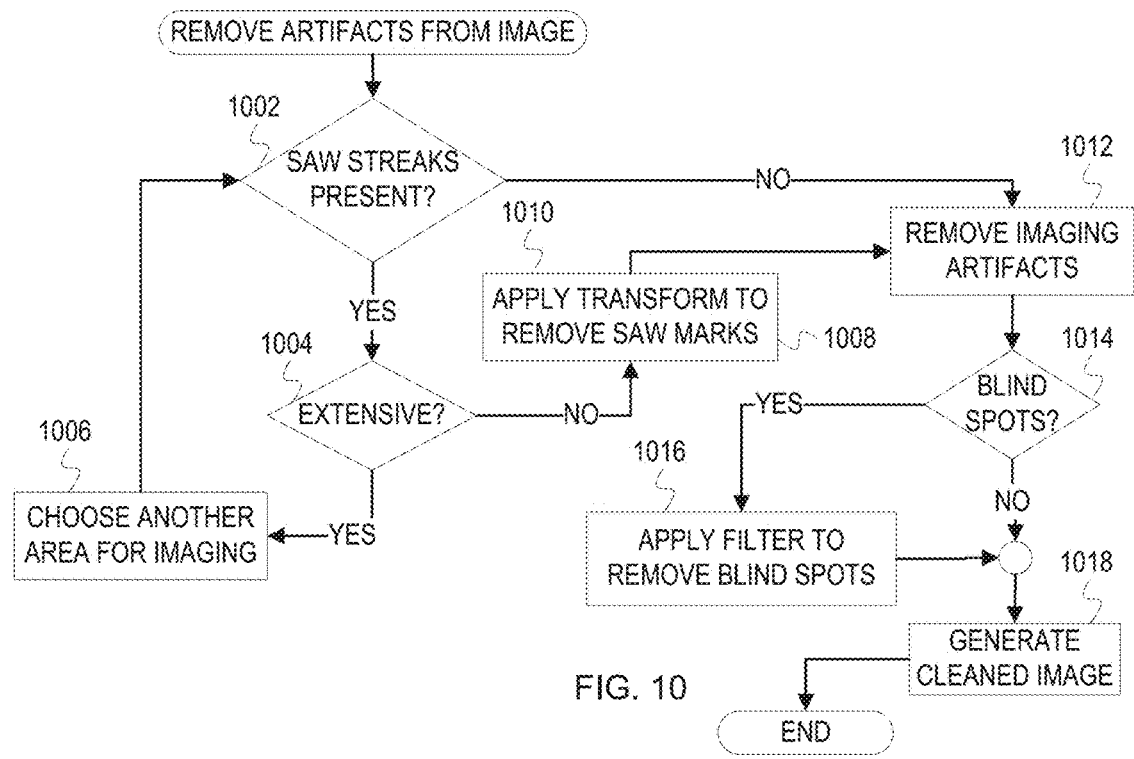
FIG. 10 is a flowchart of example operations for removing artifacts from a surface height image.

FIG. 10 is a flowchart of example operations for removing artifacts from a surface height image. Due to sample acquisition, i.e. coring and sawing, or imaging limitations, i.e. depth of field, images may contain artifacts or other areas which are unsuitable for the image processor to use as a basis for calculating surface roughness. When an image contains such artifacts, the image processor removes them based on the actions depicted in FIG. 10 or determines that another area of the sample must be imaged.

At block 1002, the image processor determines if saw streaks are present in the surface height map. The image processor can identify saw streaks by identifying periodicity resulting from cutting marks, by identifying directional trends not consistent with sedimentary particulates (as seen in the photograph 602 of FIG. 6), by determining surface roughness is too small for the expected rock identification, etc. If saw streaks are present, flow continues to block 1004. If saw streaks are not present, flow continues to block 1012.

At block 1004, the image processor determines if the saw marks or streaks are extensive. The image processor determines which areas of the sample correspond to saw marks via edge detection or other optical methods. For saw marks occluding local surface roughness or pore size distribution (i.e. extensive saw marks or streaks), flow continues to block 1006. Saw marks may be considered extensive if they occlude 10% of more of the image, or if the surface roughness near saw marks is less than 90% of expected value based on a sister sample, a look up table, etc. For saw marks that do not obscure local surface roughness or pore size distribution, flow continues to block 1010.

At block 1006, when the image processor has determined that the saw streaks or marks are either extensive or significantly reduce the calculated local surface roughness a new area is chosen for imaging. The image processor can select another area on the core sample to image, or require that the core sample be broken and reimaged. For hard rock samples, as shown in FIG. 6, saw marks can obscure surface roughness across the entire sample and require that the core sample be broken open to obtain rock face without saw marks for imaging. Flow continues to block 1002 for imaging at another sample site.

At block 1010, if the image processor determines that saw or cutting marks are not extensive, it selects an image or surface height map transform to remove the saw mark contributions from the acquired surface height. The transform can be a Hough filter or other based on edge or line detection or an areal filter based on smaller than expected surface height deviations.

At block 1012, the image processor selects and removes imaging artifacts. Imaging artifacts include deep or narrow pores, where imaging the full depth of the pore is complicated by the characteristic length of the measurement parameter. Imaging artifacts also include edge effects where sample data at the x and y limits of measurement can be distorted. Imaging artifacts also include surface heights that are too high or too deep to be accurately imaged by the method of measurement which can produce truncated values, such as when a local minima or maxima is beyond the depth of focus. Any tilt in the sample surface also introduces imaging artifacts, and sample surface height can be transformed as a projection onto a flat x, y plane.

At block 1014, the image processor determines if the LCSM image contains blind spots. Blind spots include spots where the LCSM image processor cannot focus light because of depth of focus, reflectivity, etc. If the LCSM image includes blind spots, flow continues to block 1016. If the LCSM image does not include blind spots, flow continues to block 1018.

At block 1016, the image processor applies a filter to remove blind spots. Blind spots can be excised from the surface height data used to calculate local surface height, or can be approximated as a rough surface (such as duplicated from another area of the sample) at or near the depth limit of measurement. Flow then continues to block 1018.

At block 1018, the image processor generates the cleaned image. The cleaned image, from which the image processor has removed defects, can be used to generate information about the pore size characteristic length and distribution. The processor produces the surface height map from the cleaned image. Alternatively, an estimate pore size characteristic length or a first iteration of the pore size characteristic length can be determined based on other measurements performed on sister samples. The image processor then determines the surface roughness based on the corrected image as detailed in FIG. 8.

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. For example, the operations depicted in blocks 1002 and 1006 can be performed in parallel or concurrently. With respect to FIG. 8, calculation of mineralogy is not necessary. It will be understood that each block of the flowchart illustrations and/or block diagrams, and combinations of blocks in the flowchart illustrations and/or block diagrams, can be implemented by program code. The program code may be provided to a processor of a general-purpose computer, special purpose computer, or other programmable machine or apparatus.

Figure 11:
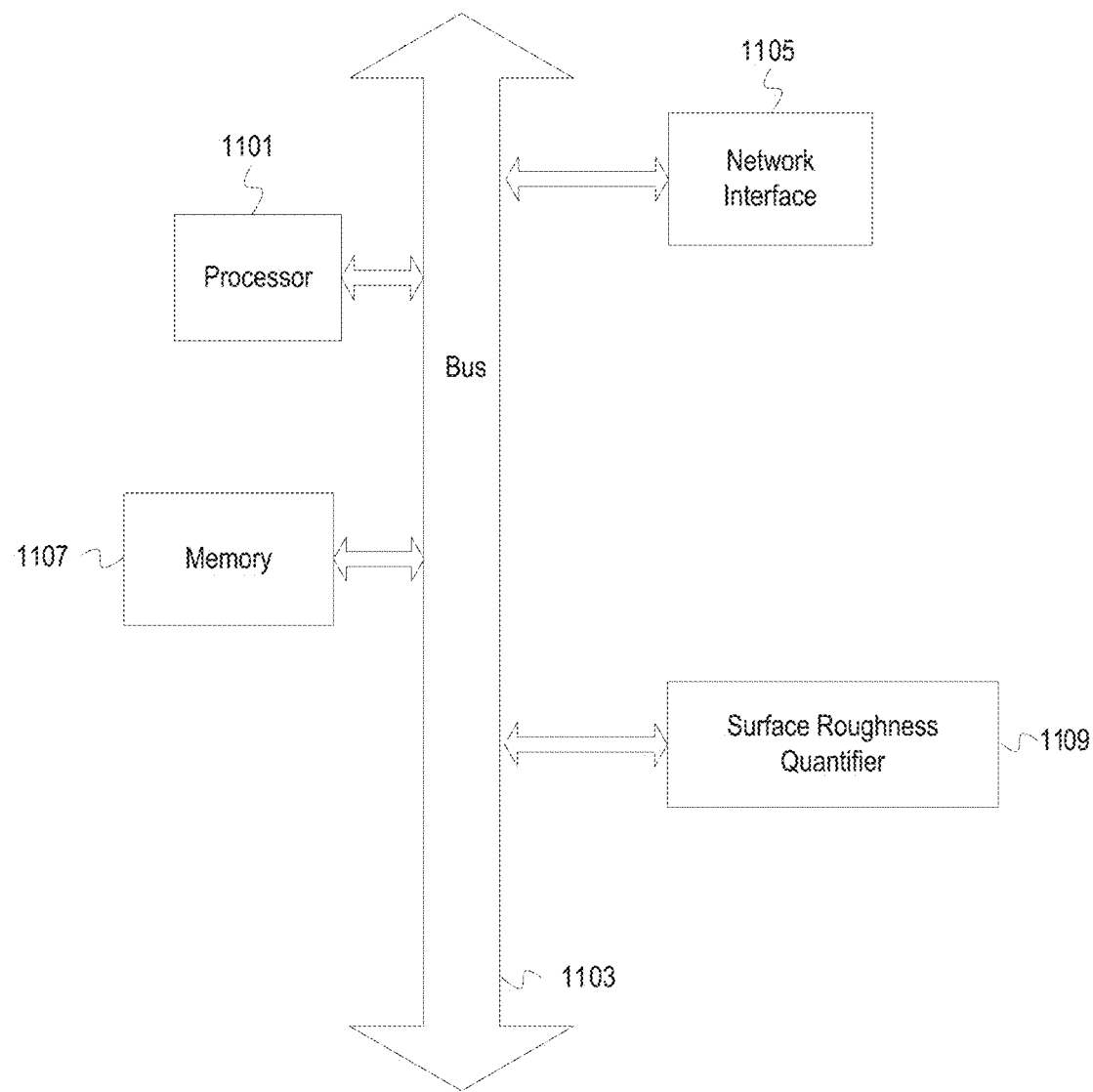
FIG. 11 is a block diagram of a computer system for calculating local surface roughness.

FIG. 11 is a block diagram of a computer system for calculating local surface roughness. The computer system includes a processor 1101, and a memory 1107. The computer system also includes a bus 1103 and a network interface 1105 that allows for communication with an imaging or surface height measurement tool. Surface height measurement data may be provided to the computer system via the memory 1107 (e.g., a storage drive). The computer system also includes a surface roughness quantifier 1109 that may be referred to as an image processor. The surface roughness quantifier 1109 quantifies surface roughness corrected to remove pore contribution as disclosed herein.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine-readable medium may be a machine-readable signal medium or a machine readable storage medium. A machine-readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine-readable storage medium may be any tangible medium that can contain, or store a program for use by or in connection with an instruction execution system, apparatus, or device. A machine-readable storage medium is not a machine-readable signal medium.

Program code embodied on a machine-readable medium may be transmitted using any appropriate medium, including but not limited to wireless, wireline, optical fiber cable, RF, etc., or any suitable combination of the foregoing.

The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

As used herein, the term "or" is inclusive unless otherwise explicitly noted. Thus, the phrase "at least one of A, B, or C" is satisfied by any element from the set {A, B, C} or any combination thereof, including multiples of any element.

Embodiment 1: A method comprising: determining, with a surface height map of a formation sample, a first length scale corresponding to pore size based, at least in part, on measurements of surface height variations from a first data representation of a formation sample; filtering the surface height map based, at least in part, on the first length scale to generate a pore feature map, wherein the pore feature map comprises measurements of surface height variations of the surface height map that are within the first length scale; subtracting the pore feature map from the surface height map to generate a pore contribution corrected surface height map, and quantifying surface roughness of the formation sample based, at least in part, on the pore contribution corrected surface height map.

Embodiment 2: The method of embodiment 1 further comprising correcting a surface relaxivity based, at least in part, on the quantified surface roughness.

Embodiment 3: The method of embodiment 2 further comprising determining a corrected pore size distribution based, at least in part, on the corrected surface relaxivity and the quantified surface roughness.

Embodiment 4: The method of any one embodiments 1 to 3 wherein quantifying the surface roughness comprises calculating a dimensionless surface roughness parameter, wherein the dimensionless surface roughness parameter is a ratio between the height of surface features of the pore contribution corrected surface height map and the distance between surface features of the pore contribution corrected surface height map.

Embodiment 5: The method of any one of embodiments 1 to 4 further comprising determining at least one of wettability or permeability based, at least in part, on the quantified surface roughness.

Embodiment 6: The method of any one of embodiments 1 to 5 further comprises determining a characteristic pore size length, wherein determining the first length scale is based, at least in part, on the characteristic pore size length.

Embodiment 7: The method of embodiment 6, wherein determining the characteristic pore size length comprises determining the characteristic pore size length based on at least one of nuclear magnetic resonance pore body volume measurements and on pore throat capillary pressure measurements.

Embodiment 8: The method of embodiment 7 further comprising obtaining the nuclear magnetic resonance pore body volume measurements with a second formation sample and the pore throat capillary pressure measurements with a third formation sample, wherein the formation sample, the second formation sample, and the third formation sample are lithologically similar samples.

Embodiment 9: The method of embodiment 7 or 8 further comprising determining a magnification for obtaining the surface height map based on at least the field of view and resolution used in measuring the second and third formation samples for determining the characteristic pore size length.

Embodiment 10: The method of any one of embodiments 1 to 9, further comprising obtaining the surface height map of the formation sample with a surface metrology technique.

Embodiment 11: The method of any one of embodiments 1 to 10 further comprising determining whether cutting marks are indicated in the surface height map and removing the indications of the cutting marks from the surface height map with a surface height transform.

Embodiment 12: A non-transitory, computer-readable medium having stored therein program code for determining surface roughness excluding the pore size contribution, the program code comprising instructions to: determine, with a surface height map of a formation sample, a first length scale corresponding to pore size based, at least in part, on measurements of surface height variations from a first data representation of a formation sample; filter the surface height map based, at least in part, on the first length scale to generate a pore feature map, wherein the pore feature map comprises measurements of surface height variations of the surface height map that are within the first length scale; subtract the pore feature map from the surface height map to generate a pore contribution corrected surface height map, and quantify surface roughness of the formation sample based, at least in part, on the pore contribution corrected surface height map.

Embodiment 13: The machine-readable media of embodiment 12, further comprising program code to: correct a surface relaxivity based, at least in part, on the quantified surface roughness.

Embodiment 14: The machine-readable media of embodiment 12 or 13, further comprising program code to: determine a characteristic pore size length, wherein determining the first length scale is based, at least in part, on the characteristic pore size length.

Embodiment 15: An apparatus comprising: a processor; and a machine-readable medium having program code executable by the processor to cause the apparatus to, determine, with a surface height map of a formation sample, a first length scale corresponding to pore size based, at least in part, on measurements of surface height variations from a first data representation of a formation sample; filter the surface height map based, at least in part, on the first length scale to generate a pore feature map, wherein the pore feature map comprises measurements of surface height variations of the surface height map that are within the first length scale; subtract the pore feature map from the surface height map to generate a pore contribution corrected surface height map, and quantify surface roughness of the formation sample based, at least in part, on the pore contribution corrected surface height map.

Embodiment 16: The apparatus of embodiment 15, wherein the machine-readable medium further comprises program code executable by the processor to: correct a surface relaxivity based, at least in part, on the quantified surface roughness.

Embodiment 17: The apparatus of embodiment 16, wherein the machine-readable medium further comprises program code executable by the processor to: determine a corrected pore size distribution based, at least in part, on the corrected surface relaxivity and the quantified surface roughness.

Embodiment 18: The apparatus of embodiment 15 or 16, wherein the machine-readable medium program code executable by the processor to quantify the surface roughness comprises program code executable by the processor to: calculate a dimensionless surface roughness parameter, wherein the dimensionless surface roughness parameter is a ratio between the height of surface features of the pore contribution corrected surface height map and the distance between surface features of the pore contribution corrected surface height map.

Embodiment 19: The apparatus of any one of embodiments 15 to 17, wherein the machine-readable medium further comprises program code executable by the processor to: determine a characteristic pore size length, wherein determining the first length scale is based, at least in part, on the characteristic pore size length.

Embodiment 20: The apparatus of embodiment 19, wherein the machine-readable medium further comprises program code executable by the processor to determine a characteristic pore size length comprises program code executable by the processor to: determine the characteristic pore size length based on at least one of nuclear magnetic resonance pore body volume measurements and on pore throat capillary pressure measurements.

The invention claimed is:

1. A method comprising:
   determining, with a surface height map of a formation sample, a first length scale corresponding to pore size based, at least in part, on measurements of surface height variations from a first data representation of a formation sample;
   filtering the surface height map based, at least in part, on the first length scale to generate a pore feature map, wherein the pore feature map comprises measurements of surface height variations of the surface height map that are within the first length scale;
   subtracting the pore feature map from the surface height map to generate a pore contribution corrected surface height map; and
   quantifying surface roughness of the formation sample based, at least in part, on the pore contribution corrected surface height map.

2. The method of claim 1 further comprising correcting a surface relaxivity based, at least in part, on the quantified surface roughness.

3. The method of claim 2 further comprising determining a corrected pore size distribution based, at least in part, on the corrected surface relaxivity and the quantified surface roughness.

4. The method of claim 1 wherein quantifying the surface roughness comprises calculating a dimensionless surface roughness parameter, wherein the dimensionless surface roughness parameter is a ratio between the height of surface features of the pore contribution corrected surface height map and the distance between surface features of the pore contribution corrected surface height map.

5. The method of claim 1 further comprising determining at least one of wettability or permeability based, at least in part, on the quantified surface roughness.

6. The method of claim 1 further comprises determining a characteristic pore size length, wherein determining the first length scale is based, at least in part, on the characteristic pore size length.

7. The method of claim 6, wherein determining the characteristic pore size length comprises determining the characteristic pore size length based on at least one of nuclear magnetic resonance pore body volume measurements and on pore throat capillary pressure measurements.

8. The method of claim 7 further comprising obtaining the nuclear magnetic resonance pore body volume measurements with a second formation sample and the pore throat capillary pressure measurements with a third formation sample, wherein the formation sample, the second formation sample, and the third formation sample are lithologically similar samples.

9. The method of claim 8 further comprising determining a magnification for obtaining the surface height map based on at least a field of view and resolution used in measuring the second and third formation samples for determining the characteristic pore size length.

10. The method of claim 1, further comprising obtaining the surface height map of the formation sample with a surface metrology technique.

11. The method of claim 1 further comprising determining whether cutting marks are indicated in the surface height map and removing the indications of the cutting marks from the surface height map with a surface height transform.

12. A non-transitory, computer-readable medium having stored therein program code for determining surface roughness excluding pore size contribution, the program code comprising instructions to:
   determine, with a surface height map of a formation sample, a first length scale corresponding to pore size based, at least in part, on measurements of surface height variations from a first data representation of a formation sample;
   filter the surface height map based, at least in part, on the first length scale to generate a pore feature map, wherein the pore feature map comprises measurements of surface height variations of the surface height map that are within the first length scale;
   subtract the pore feature map from the surface height map to generate a pore contribution corrected surface height map; and
   quantify surface roughness of the formation sample based, at least in part, on the pore contribution corrected surface height map.

13. The non-transitory, computer-readable medium of claim 12, further comprising program code to:
   correct a surface relaxivity based, at least in part, on the quantified surface roughness.

14. The non-transitory, computer-readable medium of claim 12, further comprising program code to:
   determine a characteristic pore size length, wherein determination of the first length scale is based, at least in part, on the characteristic pore size length.

15. An apparatus comprising:
   a processor; and
   a machine-readable medium having program code executable by the processor to cause the apparatus to,
      determine, with a surface height map of a formation sample, a first length scale corresponding to pore size based, at least in part, on measurements of surface height variations from a first data representation of a formation sample;
      filter the surface height map based, at least in part, on the first length scale to generate a pore feature map, wherein the pore feature map comprises measurements of surface height variations of the surface height map that are within the first length scale;
      subtract the pore feature map from the surface height map to generate a pore contribution corrected surface height map; and quantify surface roughness of the formation sample based, at least in part, on the pore contribution corrected surface height map.

16. The apparatus of claim 15, wherein the machine-readable medium further comprises program code executable by the processor to:
   correct a surface relaxivity based, at least in part, on the quantified surface roughness.

17. The apparatus of claim 16, wherein the machine-readable medium further comprises program code executable by the processor to:
   determine a corrected pore size distribution based, at least in part, on the corrected surface relaxivity and the quantified surface roughness.

18. The apparatus of claim 15, wherein the machine-readable medium program code executable by the processor to quantify the surface roughness comprises program code executable by the processor to:
   calculate a dimensionless surface roughness parameter, wherein the dimensionless surface roughness parameter is a ratio between the height of surface features of the pore contribution corrected surface height map and the distance between surface features of the pore contribution corrected surface height map.

19. The apparatus of claim 15, wherein the machine-readable medium further comprises program code executable by the processor to:
   determine a characteristic pore size length, wherein determination of the first length scale is based, at least in part, on the characteristic pore size length.

20. The apparatus of claim 19, wherein the program code to determine a characteristic pore size length comprises program code executable by the processor to cause the apparatus to:
   determine the characteristic pore size length based on at least one of nuclear magnetic resonance pore body volume measurements and on pore throat capillary pressure measurements.

* * * * *